US010754132B2

(12) United States Patent
Rogalsky et al.

(10) Patent No.: US 10,754,132 B2
(45) Date of Patent: Aug. 25, 2020

(54) IMAGING OPTICAL SYSTEM FOR MICROLITHOGRAPHY

(71) Applicant: Carl Zeiss SMT GmbH, Oberkochen (DE)

(72) Inventors: Olaf Rogalsky, Oberkochen (DE); Sonja Schneider, Oberkochen (DE); Boris Bittner, Roth (DE); Jens Kugler, Aalen (DE); Bernhard Gellrich, Aalen (DE); Rolf Freimann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1980 days.

(21) Appl. No.: 13/790,443

(22) Filed: Mar. 8, 2013

(65) Prior Publication Data
US 2013/0188246 A1    Jul. 25, 2013

Related U.S. Application Data

(63) Continuation of application No. PCT/EP2011/004744, filed on Sep. 22, 2011.
(Continued)

(30) Foreign Application Priority Data

Sep. 30, 2010 (DE) .................. 10 2010 041 708
Aug. 4, 2011 (DE) .................. 10 2011 080 437

(51) Int. Cl.
G02B 17/06    (2006.01)
G02B 27/00    (2006.01)
G03F 7/20     (2006.01)

(52) U.S. Cl.
CPC ......... G02B 17/06 (2013.01); G02B 17/0663 (2013.01); G02B 27/0012 (2013.01);
(Continued)

(58) Field of Classification Search
CPC ...... G02B 5/0891; G02B 7/008; G02B 7/023; G02B 7/028; G02B 7/04; G02B 7/181;
(Continued)

(56) References Cited

U.S. PATENT DOCUMENTS 5,852,518 A * 12/1998 Hatasawa .............. G02B 7/021
                                                    250/492.2
7,006,194 B2  2/2006 Sumiyodhi et al.
(Continued)

FOREIGN PATENT DOCUMENTS

CN    1673874 A     9/2005
CN    101836163    9/2010
(Continued)

OTHER PUBLICATIONS

Notification of Transmittal of the International Search Report and Written Opinion of the International Search Authority from corresponding PCT Application No. PCT/EP2011/004744, dated Jul. 10, 2012, 16 pages.
(Continued)

Primary Examiner — Derek S. Chapel
(74) Attorney, Agent, or Firm — Fish & Richardson P.C.

(57) ABSTRACT

An imaging optical system, in particular a projection objective, for microlithography, includes optical elements to guide electromagnetic radiation with a wavelength in a path to image an object field into an image plane. The imaging optical system includes a pupil, having coordinates $(p, q)$, which, together with the image field, having coordinates $(x, y)$ of the optical system, spans an extended 4-dimensional pupil space, having coordinates $(x, y, p, q)$, as a function of which a wavefront $W(x, y, p, q)$ of the radiation passing through the optical system is defined. The wavefront W can therefore be defined in the pupil plane as a function of an extended 4-dimensional pupil space spanned by the image field $(x, y)$ and the pupil $(p, q)$ as $W(x, y, p, q)=W(t)$, with $t=(x, y, p, q)$.

31 Claims, 18 Drawing Sheets

Related U.S. Application Data

(60) Provisional application No. 61/514,987, filed on Aug. 4, 2011, provisional application No. 61/388,081, filed on Sep. 30, 2010.

(52) U.S. Cl.
CPC ...... *G03F 7/70258* (2013.01); *G03F 7/70308* (2013.01); *G03F 7/70891* (2013.01)

(58) Field of Classification Search
CPC ...... G02B 7/198; G02B 13/143; G02B 13/18; G02B 13/24; G02B 17/06; G02B 17/0647; G02B 17/0657–0663; G02B 17/0836; G02B 17/0844–0848; G02B 17/0892; G02B 26/0816; G02B 26/0875–0891; G02B 27/0025; G02B 27/0068; G03F 7/70216–70233; G03F 7/70258–70266; G03F 7/70308; G03F 7/70858–70891
USPC ... 359/223.1, 225.1, 226.1, 226.2, 350, 351, 359/355, 364–366, 368, 384, 433, 359/554–557, 720, 850, 857–859, 359/861–863, 865, 868–869; 353/69, 353/101; 355/52, 55
See application file for complete search history.

(56) References Cited

U.S. PATENT DOCUMENTS

| | | |
|---|---|---|
| 7,081,949 B2 | 7/2006 | Hara |
| 7,372,539 B2 | 5/2008 | Kirchner et al. |
| 7,408,621 B2 | 8/2008 | Kneer et al. |
| 7,414,781 B2 | 8/2008 | Mann et al. |
| 7,522,260 B1 | 4/2009 | Kirchner et al. |
| 8,269,981 B1 | 9/2012 | Doerband et al. |
| 2002/0056815 A1 | 5/2002 | Mann et al. |
| 2004/0207828 A1 | 10/2004 | Miyajima |
| 2005/0213097 A1 | 9/2005 | Baselmans et al. |
| 2007/0058269 A1 | 3/2007 | Mann et al. |
| 2007/0195317 A1 | 8/2007 | Schottner et al. |
| 2008/0106711 A1 | 5/2008 | Beierl et al. |
| 2008/0165415 A1 | 7/2008 | Chan et al. |
| 2008/0278699 A1 | 11/2008 | Kirchner et al. |
| 2009/0185153 A1 | 7/2009 | Epple |
| 2010/0195070 A1 | 8/2010 | Loering et al. |
| 2010/0195075 A1* | 8/2010 | Chan et al. .............. 355/67 |
| 2010/0225889 A1 | 9/2010 | Sumiyoshi |
| 2011/0069295 A1 | 3/2011 | Kraehmer et al. |
| 2012/0147347 A1* | 6/2012 | Mann ............... G02B 17/0663 355/67 |

FOREIGN PATENT DOCUMENTS

| | | |
|---|---|---|
| DE | 10 2006 003 375 | 8/2007 |
| EP | 0 779 528 | 6/1997 |
| EP | 0 851 304 | 7/1998 |
| EP | 0 660 169 | 4/2000 |
| EP | 1 178 356 | 2/2002 |
| EP | 1 341 043 A2 | 9/2003 |
| EP | 1 930 771 | 6/2008 |
| EP | 1 930 772 | 6/2008 |
| JP | 2003-077805 A | 3/2003 |
| JP | 2003-257812 A | 9/2003 |
| JP | 2003-303751 A | 10/2003 |
| JP | 2008-203820 A | 9/2008 |
| JP | 2009-037251 A | 2/2009 |
| JP | 2009-508150 A | 2/2009 |
| JP | 2010-261934 | 11/2010 |
| WO | 2006/053751 | 5/2006 |
| WO | 2007031271 | 3/2007 |
| WO | WO 2007/031271 A1 | 3/2007 |
| WO | 2009/018911 | 2/2009 |
| WO | 2009018911 | 2/2009 |
| WO | WO 2009/024164 A1 | 2/2009 |
| WO | WO 2009043573 A1 * | 4/2009 |
| WO | 2009/141033 | 11/2009 |
| WO | 2010/034674 | 4/2010 |

OTHER PUBLICATIONS

Taiwan Office Action and Search Report, with English translation, for TW Appl No. 100134772, dated Aug. 13, 2014.
Daniel Malacara, Optical Shop Testing, Second Edition, Wiley Interscience Publication, Chapters 13.2.2-13.2.3, 4 pages, (1992).
Daniel Malacara, Optical Shop Testing, Second Edition, Wiley Interscience Publication, Chapters 4.1-4.6, 8 pages, (1992).
H. Gross, Handbook of Optical Systems: vol. 2 Physical Image Formation, Wiley VCH Verlag GmbH&Co KGaA, Weinheim, p. 215, (2005).
Chinese Office Action, with translation thereof, for CN Appl No. 201180047784.8, dated Nov. 26, 2014.
Japanese Office Action, with translation thereof, for JP Appl No. 2013-530608, dated Sep. 7, 2015.
Japanese Office Action with English translation thereof, for corresponding JP App No. 2013-530608, dated Aug. 12, 2016, 4 pages.

* cited by examiner (a)

(b)

$W_u(x,y,p,q) = OPL'(x,y,p,q) - OPL(x,y,p,q)$

IMAGING OPTICAL SYSTEM FOR MICROLITHOGRAPHY

CROSS-REFERENCE TO RELATED APPLICATIONS

This application is a continuation of, and claims priority under 35 USC 120 to, International Patent Application PCT/EP2011/004744, filed Sep. 22, 2011, which claims benefit under 35 USC 119 of German Patent Application DE 10 2010 041 708.4, filed Sep. 30, 2010, and German Patent Application DE 10 2011 080437.4, filed on Aug. 4, 2011. International Patent Application PCT/EP2011/004744 also claims priority under 35 USC 119 to U.S. Ser. No. 61/388,081, filed Sep. 30, 2010, and U.S. Ser. No. 61/514,987, filed Aug. 4, 2011. The entire disclosure of each of these patent applications is incorporated by reference herein.

FIELD

The disclosure relates to an imaging optical system, in particular a projection objective, for microlithography, including optical elements configured to guide electromagnetic radiation in an imaging beam path for imaging an object field into an image plane.

BACKGROUND

A projection objective is part of a projection exposure tool for microlithography which is used to produce semiconductor components. For this purpose a pattern, called a reticle, disposed in an object plane of the projection objective, is imaged by the projection objective onto a photo-sensitive layer of a substrate which is called a wafer.

Due to the constantly progressing miniaturization of the structures of the semiconductor components to be produced, increasingly more stringent desired properties are made of the imaging properties of projection objectives. This typically involves reducing imaging errors of projection objectives for microlithography to a very low level. While production related imaging errors in a projection objective can already be eliminated after production of the projection objective by post-processing (for example, aspherization of individual lenses or mirrors of the projection objective), the correction of imaging errors occurring during operation of the projection exposure tool is more difficult.

During operation, the imaging radiation of the optical elements of the projection objective used is partially absorbed, and this leads to heating of the optical elements. By thermal expansion and, if applicable, associated refractive index changes, imaging errors which can take on complicated field characteristics are induced, in particular when, as is the case with modern projection exposure tools, the beam path through the projection objective is not rotationally symmetrical relative to a central axis, and in particular individual optical elements from the beam path are only used in a partial region.

Moreover, special illumination configurations (also called illumination settings) are being used more and more in modern projection exposure tools, in particular dipole or quadrupole illuminations. These multipole illuminations lead in particular to imaging errors or higher waviness or to imaging errors in higher Zernike orders.

Usually, in order to compensate heat-induced imaging errors occurring during operation, the projection objective is provided with an optical correction system. For example, an optical correction system is known from EP 0 851 304 A2 which includes two optical correction elements which both respectively have an aspherical surface contour on their surfaces facing towards one another. The two aspherical surface contours adding up to at least approximately, zero. This type of correction system is also called an Alvarez manipulator.

With an Alvarez manipulator the two surfaces facing one another are arranged close to one another spatially, in particular in planes conjugate to one another. This type of correction system can be relatively complex because the correction elements are provided in addition to the optical elements of the optical system. Furthermore, the correction elements lead to losses in intensity. In particular with so-called free-form surface designs (in which the optical system is provided with optical elements which have non-rotationally symmetrical surfaces) providing the aforementioned correction system may be impracticable, as with free-form surface designs the optical elements are matched to one another such that the asphericity of the latter is cancelled out overall.

SUMMARY

The disclosure provides an imaging optical system with at least one non-rotationally symmetrical element and in which imaging errors occurring, for example, during operation can be effectively corrected without a complex correction mechanism.

In one aspect, the disclosure provides an imaging optical system, in particular a projection objective, for microlithography, which includes optical elements configured to guide electromagnetic radiation with a wavelength $\lambda$ in an imaging beam path for imaging an object field into an image plane. Furthermore, the imaging optical system includes a pupil, having coordinates (p, q), which, together with the image field, having coordinates (x, y) of the optical system, spans an extended 4-dimensional pupil space, having coordinates (x, y, p, q), as a function of which a wavefront W(x, y, p, q) of the radiation passing through the optical system is defined. The wavefront W of the radiation passing through the optical system can therefore be defined in the pupil plane as a function of an extended 4-dimensional pupil space spanned by the image field (x, y) and the pupil (p, q) as W(x, y, p, q)=W(t), with t=(x, y, p, q). The image field is produced by imaging the object field into the image plane.

According to this aspect of the disclosure at least a first of the optical elements, in particular two, three, four or more of the optical elements, have a non-rotationally symmetrical surface. The non-rotationally symmetrical surface has a respective two-dimensional surface deviation in relation to every rotationally symmetrical surface. The respective two-dimensional surface deviation has a difference between its greatest elevation and its deepest valley of at least $\lambda$. In other words, the non-rotationally symmetrical surface has in relation to every rotationally symmetrical surface a peak-to-valley value of at least $\lambda$. In particular, the non-rotationally symmetrical surface deviates at at least one point from the best-adapted rotationally symmetrical surface of the latter by at least $\lambda$. In order to determine the best-adapted rotationally symmetrical surface, for example, the average quadratic deviation (rms) in a prespecified direction of the non-rotationally symmetrical surface from the rotationally symmetrical surface being compared with can be minimized as a criterion. Other criteria to be minimized in order to determine a best-adapted rotationally symmetrical surface include peak-to-valley and gradient deviation.

Moreover, a sub-aperture ratio of the non-rotationally symmetrical surface deviates at every point of the object field by at least 0.01 from the sub-aperture ratio of every other surface of the optical elements located in the imaging beam path, at the respective point of the object field. Furthermore, the surface of the first optical element is configured such that by displacing the first optical element relative to the other optical elements a change to the wavefront of the optical system can be brought about which has a portion with at least two-fold symmetry, the maximum value of the wavefront change in the extended 4-dimensional pupil space being at least $1\times10^{-5}$, in particular at least $5\times10^{-5}$ of the wavelength $\lambda$. According to one embodiment the portion of the wavefront change with at least two-fold symmetry has a maximum value in the extended 4-dimensional pupil space which is at least $1\times10^{-7}$, in particular at least $1\times10^{-6}$, of the wavelength $\lambda$. Preferably the wavefront change is effected such that the latter results in a reduction of image errors.

In other words, by displacing the first optical element relative to the other optical elements a change to the wavefront of the optical surface can be brought about which has a portion with at least k-fold symmetry, k being two. A wavefront portion with k-fold symmetry is characterized in that k is the largest natural number to which it applies that after a rotation of the optical system by the angle $\varphi=360°/k$ about a prespecified normal to the image plane the wavefront portion in the extended four-dimensional pupil space is conveyed into itself. In other words, the displacement of the first optical element acts as disturbance which produces a change to the wavefront with a portion of at least 2-fold symmetry. This portion is also called at least 2-fold wavefront disturbance. A k-fold wavefront disturbance is understood to be a displacement of the first optical element by which after rotation of the optical system by the angle $\varphi=360°/k$ about the normal to the image plane, without thereby changing the displacement position of the optical element, the wavefront change in the extended 4-dimensional pupil space in the model of small deflections caused by the displacement is conveyed into itself. The change to the wavefront may be characterized by a polynomial development, such as, for example, the so-called Zernike development known to the skilled person and described in detail below. The above mentioned "portion of the wavefront having at least 2-fold symmetry" may, according to an embodiment, be defined by a development term of this polynomial development having at least 2-fold symmetry. In case of a Zernike development the "portion of the wavefront having at least 2-fold symmetry" may be given by the Zernike coefficient associated to a Zernike function having at least 2-fold symmetry. The term "portion of the wavefront" is further illustrated below.

The aforementioned displacement of the first optical element can take place by rotating the element, in particular about the normal to the image plane, advantageously by less than 10 arc minutes. Furthermore, the aforementioned displacement can take place by tilting relative to these normals and/or by shifting the element parallel and/or lateral to the normal of the image plane. The first optical element is mounted here rotatably, tiltably and/or shiftably in the optical system.

According to the aspect of the disclosure the surface of the first optical element is configured such that the maximum value of the wavefront change of the aforementioned type brought about in the extended 4-dimensional pupil space by the aforementioned displacement of the element is at least $1\times10^{-5}$ of the wavelength $\lambda$, expressed differently 1% m$\lambda$.

Here the maximum value of the wavefront change which occurs in all of the pupils assigned to all of the points of the image field is decisive, as described in more detail below. According to embodiments according to the disclosure the maximum value of the wavefront change of the aforementioned type brought about by the aforementioned displacement of the element in the extended 4-dimensional pupil space accounts for at least $5\times10^{-5}$, $1\times10^{-4}$, $1\times10^{-3}$ or $1\times10^{-2}$ of the wavelength $\lambda$.

At least the first optical element, preferably at least three optical elements of the imaging optical system, have at at least one point of their surface a deviation of at least 2 from every rotationally symmetrical surface, in particular from a rotationally symmetrical surface best-adapted to the surface of the element in question. A best-adapted rotationally symmetrical surface of this type is determined via algorithms commonly used by the person skilled in the art. A surface having the aforementioned deviation is also called a free form surface in the following.

The sub-aperture ratio of an optical element is formed by the quotient of the sub-aperture diameter and the optically free diameter. The sub-aperture diameter is, as explained in more detail below, given by the maximum diameter of a respective surface which is illuminated when imaging any, but specifically chosen, point of the object field on the optical element.

The optically free diameter is the diameter of the smallest circle around a respective reference axis of the corresponding optical element which contains the part of the optical element illuminated when imaging the whole object field. Via the deviation according to the disclosure of the sub-aperture ratio of the first optical element at every point of the object field by at least 0.01 from the sub-aperture ratio of every other surface located in the imaging beam path at the respective point of the object field, the first optical element is optically substantially further away from the other surfaces, than is the case e.g. with a single surface of an Alvarez manipulator. According to further embodiments the sub-aperture ratio of the first optical element deviates by at least 0.02, in particular by at least 0.05 from the sub-aperture ratio of every other optical surface of the optical system at the respective point of the object field. According to different embodiments according to the disclosure the sub-aperture ratios deviate pairwise by at least 1%, in particular by at least 3% or 5% from one another.

The construction of the imaging optical system according to the disclosure makes it possible to correct specific imaging errors with free form surface designs, in particular imaging errors occurring during operation, such as e.g. heat-induced imaging errors, without a complex correction mechanism. For the correction no additional correction elements, such as for example the Alvarez manipulators known from the prior art, are involved. In fact, aberrations brought about by thermal effects can be at least partially compensated by rigid body movement of at least one optical element. With the construction of the optical system according to the disclosure long-wave aberrations in particular, such as for example aberrations characterisable by the Zernike coefficient Z25, can be particularly well corrected.

With the possibility of correcting wavefront errors by displacing an optical element, the tolerances for the surface deviations from desired shapes when producing the individual optical elements are increased. The resulting errors are then eliminated on the manufactured optical system by appropriate displacement of the at least one optical element. Thus, for example, raising the surface tolerances by the factor two to ten for long-wave deviations is possible, such as for example from usually 0.1 nm to now 0.2 nm to 1 nm. Longwave deviations are in particular to be understood to be deviations which can be characterized by Zernike coefficients $Z25$ and smaller. In many cases one can therefore dispense with post-processing of the surfaces or the use of deformable mirrors.

In other words, the surface of the first optical element is provided with a specific manipulation form by which the change described above to the wavefront of the optical system is brought about. According to embodiments according to the disclosure two, three, four or more, in particular all of the optical elements of the optical system are provided with appropriate manipulation forms. Upon displacement of the optical element in question, each of these manipulation forms brings about here a change to the wavefront of the optical system which has a portion with at least 2-fold symmetry, the maximum value of the wavefront change in the extended 4-dimensional pupil space being at least $1 \times 10^{-5}$ of the wavelength $\lambda$. The change to the wavefront brought about by the manipulation forms is brought about by shearing of the manipulation form or the manipulation forms. Changes in the wavefront are also induced by the displacement of the optical element in question in its basic shape, i.e. without taking into account the manipulation form.

The solution according to the disclosure can also be used subsequently with already completed optical systems. This is advantageous if typical error characteristics are noticed after completion of the design phase during the series production of objectives, or if subsequently determined manipulators should be provided in order to correct mirror heating effects. An aberration in the form of a systematic objective-independent characteristic still remaining during the adjustment (with the amplitude fluctuating from objective to objective) can then be corrected by manipulation forms being calculated for one or more optical surfaces such that the objective-specific remaining aberration is produced when implementing rigid body movements provided by the actuating elements.

In the same way an appropriate manipulator for compensating mirror heating effects can be created after the event, and new objectives to be built, for example, can be equipped with the latter.

According to a further embodiment according to the disclosure of the imaging optical system the sub-aperture ratio for each of the optical elements deviates by at least 0.01, in particular by at least 0.02 or by at least 0.05 from the respective sub-aperture ratio of the other optical elements.

According to a further embodiment according to the disclosure the optical elements are configured such that every combination of two of the optical elements has an overall optical effect which corresponds to the optical effect of a non-rotationally symmetrical optical element. A non-rotationally symmetrical element in this context has a non-rotationally symmetrical surface according to the above definition according to which the latter has a respective two-dimensional surface deviation in relation to every rotationally symmetrical surface, which two-dimensional surface has a difference between its greatest elevation and its deepest valley of at least $\lambda$. In particular, the overall optical effect does not correspond to the optical effect of a spherical optical element. Here, a plane plate is understood to be a special case of a spherical optical element, namely with an infinite diameter. In other words the respective combination of the two optical elements has the effect of a free form surface onto the wavefront of an irradiated wave. In other words, there is not a single optical element compensating one of the non-rotationally symmetrical optical elements. Furthermore, the optical elements are preferably configured such that the (non-rotationally symmetrical) asphericity of each of the aspherical optical elements is compensated by the asphericities of all of the other aspherical optical elements of the optical system.

According to a further embodiment according to the disclosure all of the non-rotationally symmetrical surfaces of the optical system are disposed in planes which are not conjugate to one another. In other words, there is no pair of aspherical optical elements in planes conjugate to one another. Therefore the asphericity of an optical element cannot be compensated by a single further optical element.

According to a further embodiment according to the disclosure the optical elements are configured as mirrors. Compared with the Alvarez lenses from the prior art operated in transmitted light, in this embodiment the paths of travel for correction of the imaging errors are smaller by approximately the factor four. This is due to the fact that in reflection the optical path length changes by twice the form change, whereas in transmission it is multiplied by the factor n−1, which is approximately 0.5. Paths of travel are understood to be the respective paths which are covered during the displacement according to the disclosure by the first optical element or a number of optical elements in order to correct the imaging errors. According to one exemplary embodiment of an optical system imaging in the EUV wavelength range a correction of a desired Zernike aberration of approximately 1 nm is produced for a manipulation form with a difference between greatest elevation and deepest valley of 75 nm on a mirror of the system with a manipulator path of travel of 50 µm. Therefore, the Zernike aberrations can be set with good resolution in the sub-nm range.

The specified amplitude of the manipulation form is generally considerably smaller than the basic deviation of the mirror surface from the rotational symmetry already provided in the optical design. The aforementioned basic deviation is determined by the design optimization of the optical system. Due to the relatively small amplitude of the manipulation form the mirror can generally be produced with the manipulation form without any additional cost if the manipulation form is already taken into account in the optics design, as proposed according to one aspect of the disclosure. Furthermore, larger amplitudes of the manipulation form reduce the manipulator paths of travel, but make it hard to correct the design of the non-deflected system.

According to one variant the optical elements are configured for guiding the electromagnetic radiation in the form of EUV radiation, in particular radiation with a wavelength smaller than 100 nm, for example a wavelength of 13.5 nm or 6.8 nm. According to a further embodiment according to the disclosure at least three of the optical elements have a non-rotationally symmetrical surface.

As already stated above, according to one embodiment according to the disclosure the displacement of the first optical element includes rotation of the first optical element. Furthermore, the displacement of the first optical element may include rotation and/or tilting of the first optical element relative to a reference axis disposed perpendicular to the image plane. According to a further embodiment according to the disclosure the displacement of the first optical element includes a shift of the first optical element.

According to an embodiment according to the disclosure, by rotating at least the first optical element the astigmatism of the imaging optical system can be changed. In particular, the 45° astigmatism can be changed.

According to a further embodiment according to the disclosure the displacement of the first optical element serving to change the wavefront is implemented by rotating the first optical element relative to an axis of rotation which runs through the center point of a sphere best-adapted to the non-rotationally symmetrical surface. This axis of rotation is particularly advantageous when a rotationally symmetrical portion of the non-spherical surface of the optical element in question only deviates slightly from the spherical shape. A small deviation of this type is characterized by a maximum height difference (peak to valley) of less than 10000λ.

According to a further embodiment according to the disclosure the displacement of the first optical element serving to change the wavefront is implemented by rotating the first optical element relative to an axis of rotation which is the axis of symmetry of a rotationally symmetrical surface best-adapted to the non-rotationally symmetrical surface.

According to a further embodiment the axis of rotation stands perpendicularly on the yz plane which designates the plane of symmetry of a mirror—symmetrical optical system serving the present optical system as a reference system. The plane of symmetry is defined in particular by the plane of symmetry of a mirror symmetrical reference surface best-adapted to the non-rotationally symmetrical surface of the first optical element. In this case an astigmatism with 0° orientation can also be corrected provided the non-rotationally symmetrical element has a three-fold symmetry. Here 0° is to be understood in respect of the orientation of the symmetry plane. In general it applies here to optical elements with n-fold symmetry that the rotation about an axis, which stands perpendicularly on the plane of symmetry of the objective, induces an image error with (n−1)-fold symmetry which is at an angle of 0° to the y axis, i.e. is mirror symmetrical in relation to the yz plane. If on the other hand the axis of rotation lies in the plane of symmetry of the objective, and does not pass through the center point of the best-adapted sphere, then the induced image error has a (n−1)-fold symmetry and is at an angle of 0° to the x axis, i.e. the image error is antisymmetrical to the yz plane. Finally, if the axis of rotation lies in the yz plane and passes through the center point of the best-adapted sphere, then the image error is n-fold with 0° orientation to the x axis, i.e. the image error is antisymmetrical to the yz plane. For axes of rotation which lie in the yz plane and pass close to the center point of the best-adapted sphere, a mixed form of the two last-specified image errors is produced.

According to a further embodiment according to the disclosure a non-rotationally symmetrical portion of the surface of the first optical element has an n-fold symmetry, n being at least two, in particular at least 3, 4 or 5. Preferably the reference axis relative to the symmetry is the axis of rotation of the displacement if the displacement takes place by rotation. An n-fold symmetry is basically to be understood to mean that n is the largest natural number which applies, so that upon rotation of the optical element in question relative to an axis of rotation by the angle 360°/n the surface topography remains unchanged and is conveyed into itself.

According to a further embodiment according to the disclosure a non-rotationally symmetrical portion of the surface of the first optical element has an astigmatic form. Therefore the astigmatism of the optical system can be changed without introducing undesired parasitic aberrations to a greater extent.

According to one embodiment the non-rotationally symmetrical portion has a minimum amplitude of 10λ. Therefore smaller angles of rotation can already show a significant manipulator effect. Thus, by rotating about 1 mrad, for example, an image effect of 20 can be achieved.

According to a further embodiment according to the disclosure the surface of the first optical element has a rotationally symmetrical portion, and the amplitude of the rotationally symmetrical portion is small in comparison to the amplitude of the non-rotationally symmetrical portion. Therefore, inaccuracies in the lateral position of the optical element only lead to slight undesired parasitic aberrations upon rotation.

According to a further embodiment according to the disclosure the imaging optical system includes four to eight optical elements with a non-rotationally symmetrical surface, in particular according to the above definition according to which the non-rotationally symmetrical surface has a respective two-dimensional surface deviation in relation to every rotationally symmetrical surface which has a difference between its greatest elevation and its deepest valley of at least λ.

Furthermore, according to an aspect of the disclosure an imaging optical system, in particular a projection objective, for microlithography, including optical elements is provided, the optical elements being configured to guide electromagnetic radiation with a wavelength λ in an imaging beam path for imaging an object field from an object plane into an image plane. The imaging optical system further includes a pupil which, together with the image field of the optical system, spans an extended 4-dimensional pupil space, as a function of which a wavefront of the radiation passing through the optical system is defined. According to the aspect of the disclosure at least a first of the optical elements has a non-rotationally symmetrical surface which in relation to every rotationally symmetrical surface has a two-dimensional surface deviation. The two-dimensional surface deviation has a difference between its greatest elevation and its deepest valley of at least λ. A sup-aperture ratio of the non-rotationally symmetrical surface deviates at every point of the object field by at least 0.01 from the sub-aperture ratio of every other surface of the optical elements, which is located in the imaging beam path, at the respective point of the object field. Furthermore, the surface of the first optical element is configured such that by displacing the first optical element relative to the other optical elements a change to the wavefront that cannot be brought about by displacing an optical element of an imaging optical system with a rotationally symmetrical surface can be produced, the maximum value of the wavefront change in the extended 4-dimensional pupil space being at least $1 \times 10^{-5}$ of the wavelength λ. All of the advantageous features of the imaging optical system mentioned above can correspondingly be applied to this embodiment according to the disclosure.

For example, a change to the wavefront with 2-fold symmetry or a higher number-fold symmetry cannot be brought about by displacing a rotationally symmetrical optical surface. But specific wavefront changes with one-fold symmetry cannot be brought about either under certain circumstances by displacing a rotationally symmetrical optical surface. In the specific part of the description all wavefront changes that can be brought about by displacing a rotationally symmetrical optical surface are defined in a general form. From this one can derive all changes that can be produced by displacement of the optical element according to the disclosure with the non-rotationally symmetrical surface.

Furthermore, according to another aspect of the disclosure an imaging optical system, in particular a projection objective, for microlithography is produced including optical elements configured to guide electromagnetic radiation with a wavelength λ in an imaging beam path for imaging an object field from an object plane into an image plane. According to this aspect of the disclosure at least two of the optical elements respectively have a non-mirror-symmetrical surface which deviates at at least one point from each mirror-symmetrical surface by at least λ/10, in particular by at least λ/5. The sub-aperture ratios of the non-mirror-symmetrical surfaces deviate from one another at each point of the object field by at least 0.01, in particular by at least 0.02 or at least 0.05.

All of the advantageous features of the imaging optical system mentioned above can correspondingly be applied to this embodiment according to the disclosure. The production of an optical system including at least two optical elements, which has a break in symmetry of the aforementioned dimension, is already provided according to the disclosure in the optical design. This takes place in particular according to one of the embodiments mentioned below of a method according to the disclosure for the optical design of an imaging optical system. A deviation from the mirror symmetry of the aforementioned dimension for at least two optical elements of an imaging optical system cannot be achieved by subsequent mechanical processing, such as for example via the method applied to intrinsically corrected aspheres, described in more detail below.

Furthermore, according to another aspect of the disclosure an optical element for an imaging optical system, in particular a projection objective, for microlithography, including a non-mirror-symmetrical surface is produced. The optical element is configured to change the wavefront of incoming radiation with a wavelength λ, the non-mirror-symmetrical surface deviating by at least 10λ, in particular by at least 20λ, from each mirror symmetrical surface at at least one point. The production of an optical element which has a break in symmetry of the aforementioned dimension is already provided according to the disclosure in the optical design. This takes place in particular according to one of the embodiments mentioned below of a method according to the disclosure for the optical design of an imaging optical system. A deviation from the mirror symmetry of the aforementioned dimension of an individual optical element cannot be achieved by subsequent mechanical processing, such as by the method applied to intrinsically corrected aspheres described in more detail below.

Furthermore, according to another aspect of the disclosure a mirror element for an imaging optical system, in particular a projection objective, for microlithography is provided, which includes a non-rotationally symmetrical surface which is configured to change the wavefront of incoming radiation with a wavelength λ in the EUV wavelength range, and which has a deviation of at least 500λ in relation to each rotationally symmetrical surface at at least one point.

This type of surface has a larger deviation from the spherical shape than a so-called nano-free form surface. The latter stands for deviations from the rotational symmetry desired by the design. This type of mirror element is suitable as an optical element of the optical system according to the disclosure with which by displacing the element, the change to the wavefront described above, which cannot be brought about by displacement of a rotationally symmetrical surface, can be produced. All of the advantageous features of the imaging optical system mentioned above can correspondingly be applied to the optical element or mirror element according to the disclosure just described.

Furthermore, according to another aspect of the disclosure a method for the optical design of an imaging optical system for microlithography including a pre-specified number of optical elements is provided. Depending on the embodiment this can be an imaging optical system with 4, 6, 8 or a different number of optical elements. With the method according to this aspect of the disclosure in a first design step using an optimisation algorithm the surface shapes of the optical elements are determined such that a wavefront error of the entire optical system achieves or falls below a pre-specified threshold characteristic. Furthermore, in a further design step at least one of the surface shapes determined using the optimization algorithm is modified by additive overlaying with a manipulation form, the manipulation form being configured such that when displacing the optical element including the modified surface shape the wavefront error of the optical system can be changed.

In other words, according to the disclosure a conventional optical design calculation is first of all made with which the wavefront error of the entire optical system is minimized. Here, using a first optimization algorithm the surface shapes of the optical elements, which can be in the form of mirrors, for example, are determined such that a wavefront error of the entire optical system achieves or falls below a pre-specified threshold characteristic. A wavefront error of the entire optical system is understood as the deviation of the wavefront of an irradiated wave from a desired wavefront after passing through the entire optical system. Generally the irradiated wave is configured such that a spherical wave results as the desired wavefront. The threshold characteristic can, for example, specify different thresholds for individual Zernike coefficients, uniform thresholds for the Zernike coefficients or also only one RMS value for the entire wavefront deviation. A suitable threshold value for the single Zernike coefficients may, dependent on the aperture and the desire for the total wave front deviation, be at for example 0.2 nm, 0.1 nm or also 0.05 nm for an EUV system. A suitable threshold for the RMS value of the total wave front deviation may also be at 0.2 nm, 0.1 nm or also 0.05 nm.

As a next step of the design method according to the disclosure at least one of the surface shapes determined in the first step is modified by additive overlaying with a manipulation form. The manipulation form is configured such that when displacing the optical element, which has the surface shape modified with the manipulation form, the wavefront error can be manipulated in the desired way. In connection with this one also speaks of a desired manipulation effect. The manipulation form can therefore, for example, be designed such that by displacing the mirror configured with the latter, a specific Zernike image error, such as for example astigmatism, or a specific combination of Zernike image errors, can be changed. Displacement of the mirror can include a shift, a rotation and/or tilting relative to a reference axis disposed perpendicularly to the image plane of the optical system.

The optical design method according to the disclosure makes it possible to produce an imaging optical system in one of the embodiments according to the disclosure described above. By applying the design method according to the disclosure the possibility is created of producing an optical element with a large symmetry deviation in the optical surface shape of the latter. The deviations achieved in this way are considerably greater than deviations that can be achieved by mechanical processing downstream of the production of the optical element. With the latter production method the optical design provides mirror-symmetrical data in the conventional way, the optical element is initially produced according to the optical design, and finally the mirror symmetry is broken by ion beam abrasion.

According to one embodiment according to the disclosure, in a further design step the non-modified surface shapes are changed via a further optimization algorithm such that a change to the wavefront error of the optical system brought about by the modification of the at least one optical surface shape in the non-displaced state is at least partially compensated. "Non-displaced" state is to be understood as meaning that the optical element including the modified surface shape is non-displaced relative to the position specified by the basic design. The basic design is to be understood as the design determined in the first design step. In other words, the intervention into the wavefront of the optical system in the non-displaced state made by modifying the optical element in question via the manipulation form is compensated at least partially, in particular by at least 95%, at least 90%, at least 75% or at least 50%, by changing the surface shapes of the further optical elements.

According to a further embodiment according to the disclosure a manipulator quality and a compensation quality is determined with respect to the manipulation form used. The manipulator quality specifies to what extent the characteristic of the wavefront error can be changed in the desired way by displacing the optical element including the manipulation form. The compensation quality specifies to what extent the change to the wavefront error, which is produced by modifying the at least one optical surface shape with the manipulation form in the non-displaced state, is compensated by the change to the surface shapes of the optical elements not modified by a manipulation form. Upon the basis of the manipulator quality determined and of the compensation quality determined it is decided whether the manipulation form used is used in the design.

According to a further embodiment according to the disclosure the manipulation form has between 1.5 and 10 period lengths, also called spatial frequencies, over the diameter of the surface shape to be modified.

According to a further embodiment according to the disclosure the imaging optical system is configured to operate with a wavelength $\lambda$, and the manipulation form defines a non-rotationally symmetrical surface which has a respective two-dimensional surface deviation in relation to every rotationally symmetrical surface, which two-dimensional surface deviation has a difference between its greatest elevation and its deepest valley, or a peak to valley value, of at least $\lambda$. In particular, this embodiment also includes the case where, after additive overlaying with the manipulation form, the surface of the optical element defines a non-rotationally symmetrical surface which in relation to every rotationally symmetrical surface has a peak to valley value of at least $\lambda$.

According to a further embodiment according to the disclosure the optical system is configured to image an object field into an image plane. Furthermore, a sub-aperture ratio of the surface modified with the manipulation form deviates at every point of the object field by at least 0.01 from the sub-aperture ratio of every other surface of the optical elements located in the imaging beam path of the optical system at the respective point of the object field.

According to a further embodiment according to the disclosure the manipulation form is configured such that when displacing the optical element having the modified surface shape the characteristic of the wavefront error of the optical system can be changed such that a change to the wavefront error is brought about which has a portion with at least 2-fold symmetry, and the maximum value of the wavefront change in an extended 4-dimensional pupil space is at least $1 \times 10^{-5}$ of the wavelength $\lambda$. The 4-dimensional pupil space is defined as already described above in relation to the optical system according to the disclosure.

According to a further embodiment according to the disclosure the manipulation form is configured such that when displacing the optical element having the modified surface shape, the wavefront error of the optical system can be changed in a specific way. This change to the wavefront error characteristic is characterized by this type of change to the wavefront error which cannot be brought about by displacement of an optical element with a rotationally symmetrical surface, and the maximum value of the wavefront change in an extended 4-dimensional pupil space is at least $1 \times 10^{-5}$ of the wavelength $\lambda$.

According to a further embodiment according to the disclosure the manipulation form is configured such that when displacing the optical element having the modified surface shape, the characteristic of the wavefront error of the optical system can be changed such that the wavefront error is specifically corrected by a Zernike image error. This type of Zernike image error can be for example the second-order astigmatism aberration characterized by Zernike coefficients Z5 and Z6 or the third-order coma aberration characterized by Zernike coefficients Z7 and Z8. Here "order" denotes the radial order.

According to a further embodiment according to the disclosure the manipulation form is determined with the following steps: pre-specifying a number of base forms, simulated modification of the surface shape provided for the manipulation form by additive overlaying with respectively one of the base forms, calculating the effect of at least one displacement of the optical element having the modified surface shape upon the wavefront error for each of the base forms, and selecting a set of base forms via a further optimization algorithm upon the basis of a desired manipulation effect and generation of the manipulation form by combining the selected base forms. In other words, the optimization algorithm selects the base forms such that the latter in combination bring about a desired change to the characteristic of the wavefront error upon implementing an appropriate displacement.

According to a further embodiment according to the disclosure the manipulation form is chosen such that the effect of a production error in the surface shape of one of the modified optical elements in the range of 0.1 to 0.5 nm upon the imaging quality of the optical system can be compensated by at least 90% by displacing the at least one optical element modified with a manipulation form. Preferably the manipulation form is matched to a typical, in particular regularly occurring, production error.

The wavefront errors of an imaging optical system produced upon the basis of the design determined by the method according to the disclosure can be corrected by displacing the at least one optical element modified with the manipulation form. In addition, individual surfaces can also be subsequently processed, as with the method described above, in order to produce intrinsically corrected aspheres. Moreover or alternatively, deformable mirrors can also be used.

Furthermore, according to another aspect of the disclosure a method for the optical design of an imaging optical system for microlithography including a pre-specified number of optical elements is provided. With this method the surface shapes of the optical elements are determined via an optimization algorithm characterized by a merit function. The merit function includes as evaluation parameters a wavefront error of the entire optical system and at least one manipulation sensitivity. The manipulation sensitivity is defined by an effect of a displacement of one of the optical elements upon an aberration of the optical system defined by a pre-specified characteristic of the wavefront error.

In other words, the manipulation sensitivity defines response characteristics of a wavefront aberration dependently upon a displacement of a mirror called a manipulation mirror. Therefore, the manipulation sensitivity establishes a relationship between the extent of displacement, such as for example the length of the displacement path, and the extent of the wavefront aberration changed in this way. The optimization algorithm preferably determines the surface shapes of the optical element such that the wavefront error of the entire optical system achieves or falls below a pre-specified threshold characteristic, and the manipulation sensitivity of at least one optical element achieves or falls below a specific threshold.

This design method makes it possible, via just a single optimization algorithm, to generate design data for optical elements which make it possible to produce an imaging optical system in one of the preceding embodiments according to the disclosure.

Appropriate advantageous features of the imaging optical system described above can be applied correspondingly to the design method according to the disclosure.

BRIEF DESCRIPTION OF THE DRAWINGS

The above features, and further advantageous features of the disclosure are illustrated in the following detailed description of exemplary embodiments according to the disclosure with reference to the attached diagrammatic drawings, in which.

DETAILED DESCRIPTION OF EXEMPLARY EMBODIMENTS ACCORDING TO THE DISCLOSURE

In the exemplary embodiments described below, elements which are similar to one another functionally or structurally are provided as far as possible with the same or similar reference numbers. Therefore, in order to understand the features of the individual elements of a specific exemplary embodiment, reference should be made to the description of other exemplary embodiments or to the general description of the disclosure.

Figure 1:
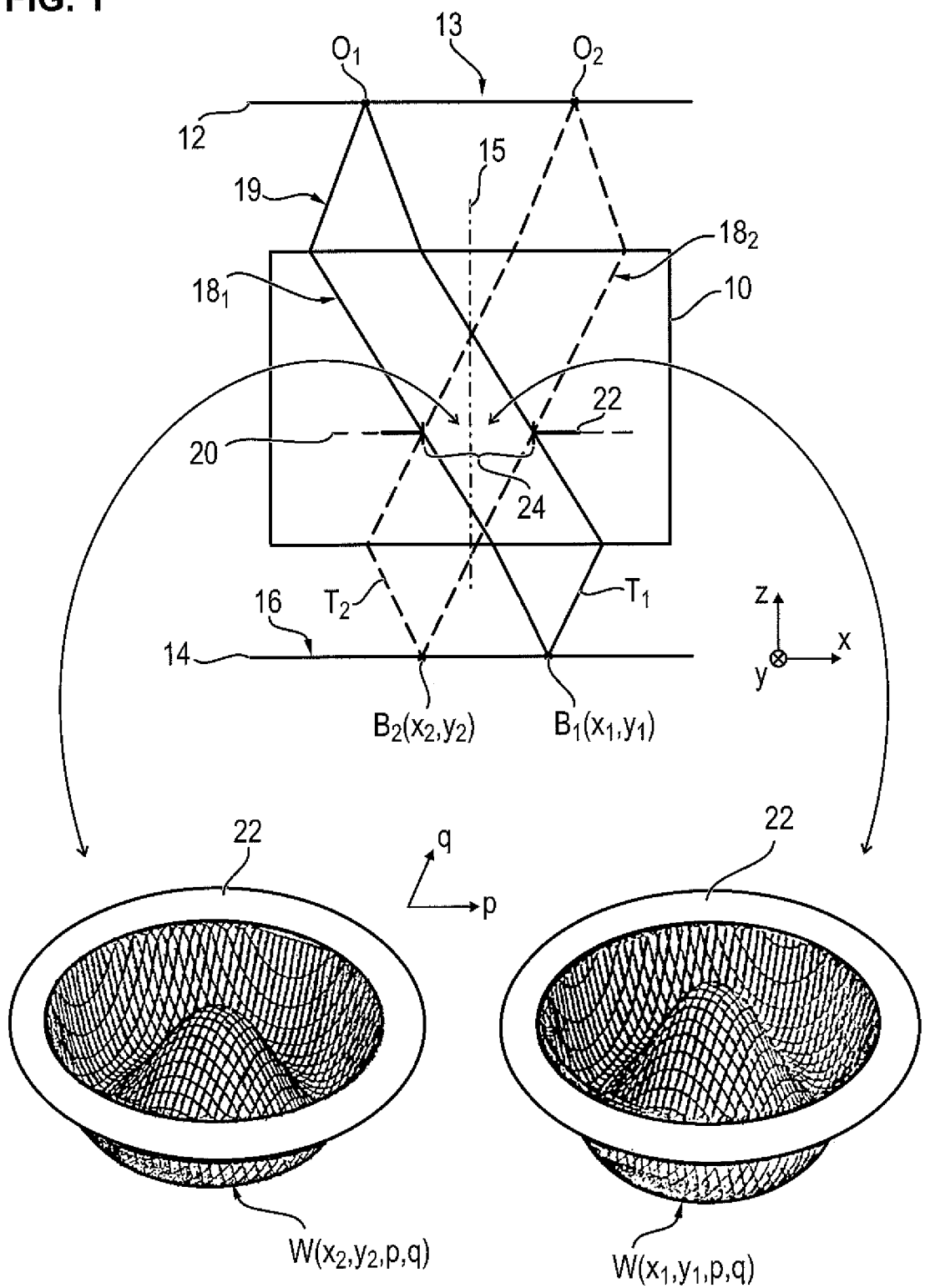
FIG. 1 an illustration of the mode of operation of a projection objective of an exposure tool for microlithography when imaging mask structures from an object plane into an image plane with an exemplary illustration of a wavefront distribution in the pupil of the projection objective.

In order to facilitate the description of the projection exposure tool a Cartesian xyz coordinate system is specified in the drawing from which the respective relative position of the components shown in the figures is made clear. In FIG. 1 the y direction runs perpendicular to the drawing plane into the latter, the x direction to the right and the z direction upwards.

Figure 2:
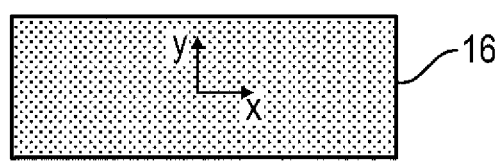
FIG. 2 an exemplary illustration of the shape of an image field of the projection objective according to FIG. 1.

FIG. 1 illustrates diagrammatically an imaging optical system 10 in the form of a projection objective of a projection exposure tool for microlithography. During operation the optical system 10 images a region to be exposed of a mask disposed in the object plane 12, the so-called object field 13, into an image plane 14, in which a wafer is disposed. The object field 13 is imaged here onto an image field 16, which is pictured in FIG. 2 by way of example for the case of a step and scan projection exposure tool. In this case the image field 16 has a rectangular shape which is shorter in the scanning direction than laterally to the latter. The optical system 10 has a system axis which is disposed perpendicularly to the image plane 14.

FIG. 1 shows as an example the respective imaging beam path $18_1$ and $18_2$ through the optical system 10 for the imaging of two different points $O_1$ and $O_2$ of the object field 13 onto field points $B_1$ and $B_2$ of the image field 16. The imaging radiation 19 used here has a wavelength λ which preferably comes within the EUV wavelength range, in particular with a wavelength of below 100 nm, e.g. approximately 13.5 nm or 6.8 nm. The optical system 10 has a pupil plane 20 in which an aperture diaphragm 22 is disposed.

Figure 3:
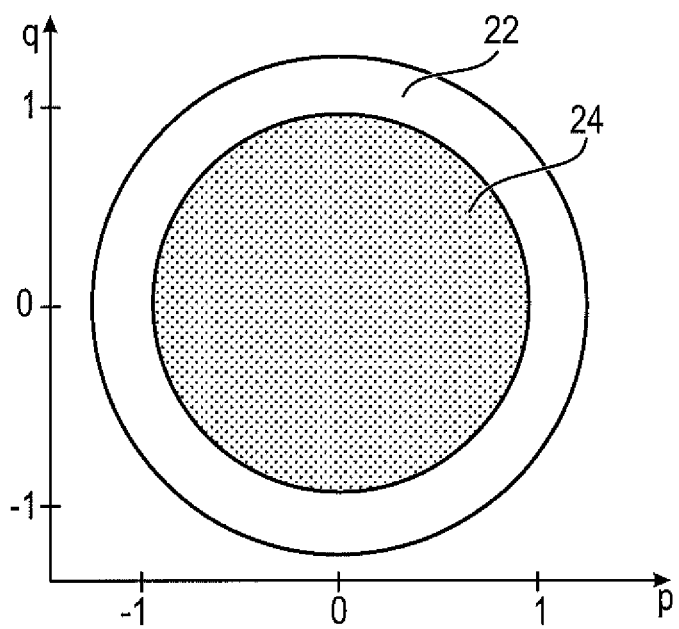
FIG. 3 an exemplary illustration of the shape of a pupil of the projection objective according to FIG. 1.

A pupil plane 20 is characterized in that the local intensity distribution of the imaging radiation 19, which converges onto a specific field point in the image plane 14, corresponds in the pupil plane 20 to the angularly resolved intensity distribution at this field point. This correspondence is guaranteed when the imaging optical system 10 is sinus-corrected, as in the present case. The surface of the pupil plane 20 delimited by the aperture diaphragm 22 is called the pupil 24 of the optical system 10, as illustrated in FIG. 3.

In other words, one generally understands by a pupil 24 of an imaging optical system 10 an image of the aperture diaphragm 22 which delimits the imaging beam path. The planes in which these images come to lie are called pupil planes. Since, however, the images of the aperture diaphragm 22 are not necessarily exactly level, in general the planes which correspond approximately to these images are also called pupil planes. The plane of the aperture diaphragm itself is also called a pupil plane. If the aperture plane is not level, the plane which corresponds best to the aperture diaphragm is called a pupil plane, as with the images of the aperture diaphragm.

An entrance pupil of the imaging optical system 10 is understood as the image of the aperture diaphragm 22 which is produced when the aperture diaphragm 22 is imaged through the part of the imaging optical system 10 which lies between the object plane 12 and the aperture diaphragm 22. Correspondingly, the exit pupil is the image of the aperture diaphragm 22 which is produced when one images the aperture diaphragm 22 through the part of the imaging optical system 10 which lies between the image plane 14 and the aperture diaphragm 22.

In an alternative definition a pupil is the region in the imaging beam path of the imaging optical system 10 in which individual beams originating from the object field points $O_n$ intersect, which individual beams are respectively assigned to the same illumination angle relative to the main beams originating from these object field points. The plane in which the intersection points of the individual beams according to the alternative pupil definition lie, or which come closest to the spatial distribution of these intersection points, which do not necessarily have to lie exactly in a plane, can be called the pupil plane.

The coordinates of the image field 16 in the image plane 14 are identified as (x, y), the coordinates of the pupil 24 in the pupil plane 20 as (p, q). The partial waves $T_n$ of the imaging radiation, which converge at the individual field points $B_n$ of the image field 16, respectively have a particular wavefront distribution $W_n$ (p, q) in the pupil 24. In FIG. 1, for the two image points $B_1$ with the image field coordinate $(x_1, y_1)$ and $B_2$ with the image field coordinate $(x_2, y_2)$ exemplary wavefront distributions $W_1(p, q)$ $W(x_1, y_1, p, q)$ and $W_2(p, q)$ $W(x_2, y_2, p, q)$ are shown for the purpose of illustration. These wavefront distributions only serve to illustrate the basic functional principle of a projection exposure tool and are not necessarily representative of wavefront distributions occurring according to the disclosure.

The wavefront W of the imaging radiation 19 passing through the optical system 10 can therefore be defined in the pupil plane 20 as a function of an extended 4-dimensional pupil space spanned by the image field (x, y) and the pupil (p, q) as follows:

$$W(x,y,p,q)=W(t) \text{ with } t=(x,y,p,q) \quad (1)$$

The location coordinates (x, y) and the pupil coordinates (p, q) are standardized to the maximum height of the image field 16 and to the numerical aperture NA so that the coordinates are dimension-less and $x^2+y^2 \leq 1$ and $p^2+q^2 \leq 1$.

Figure 5:
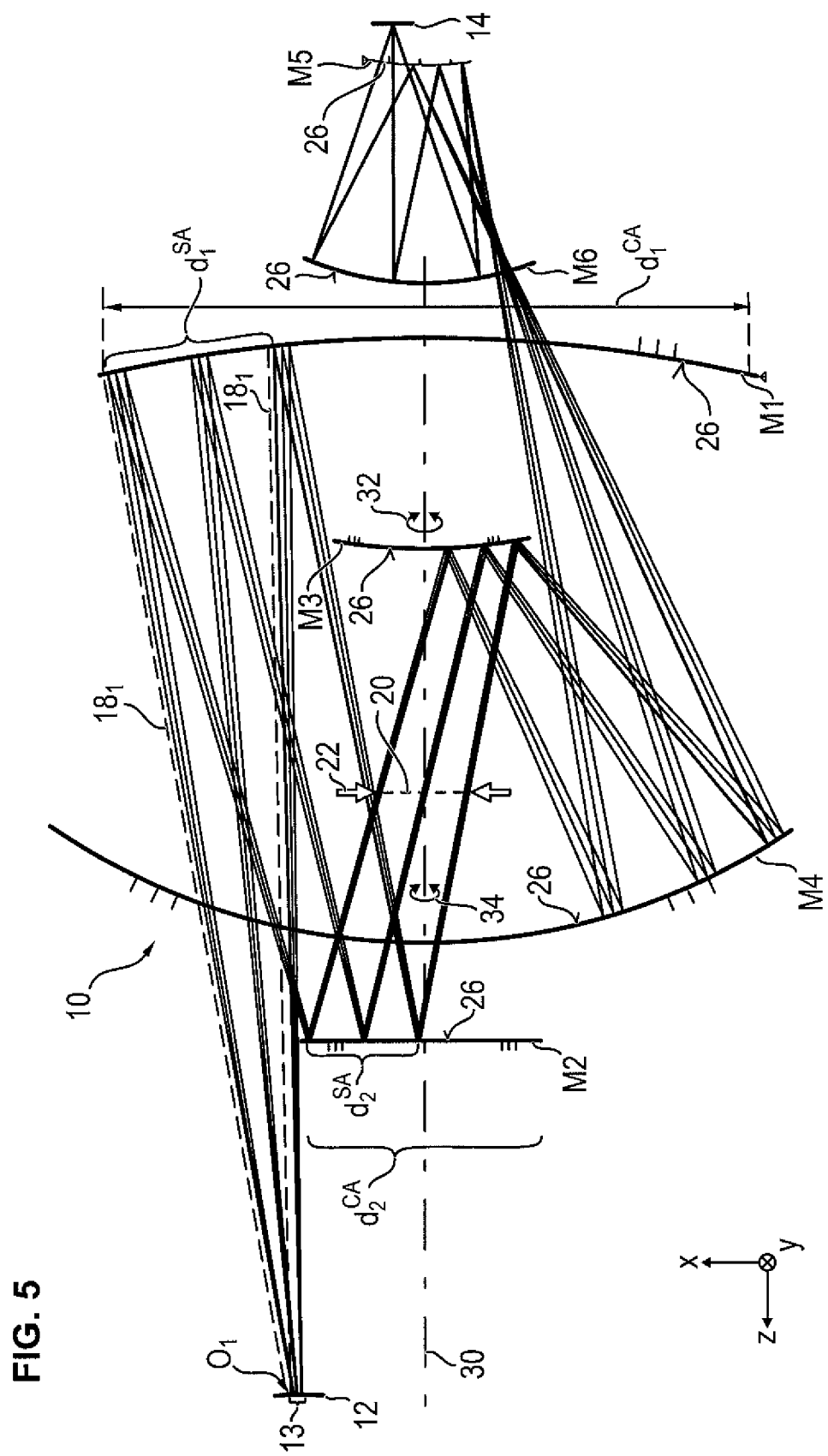
FIG. 5 a sectional view through an exemplary embodiment of a projection objective according to FIG. 1 with six mirror elements.

FIG. 5 shows a sectional view through an exemplary embodiment according to the disclosure of an imaging optical system 10 according to FIG. 1 in the form of a projection objective of a projection exposure tool for microlithography. The latter has exclusively reflective optical elements in the form of six mirrors M1 to M6 which are designed to reflect EUV radiation.

Figure 4:
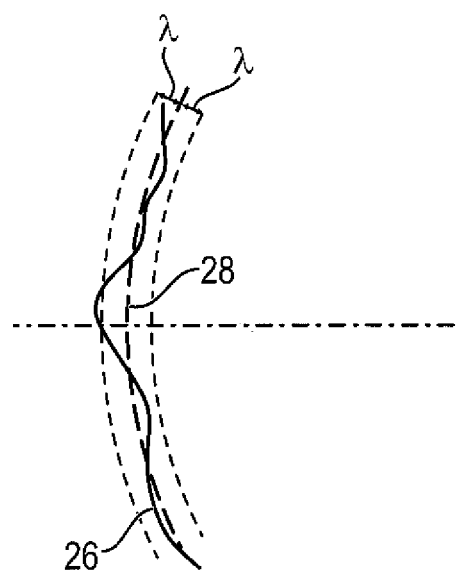
FIG. 4 an illustration of deviations of the surface of an optical element of the projection objective according to FIG. 1 from a spherical surface.

The optical system 10 according to FIG. 5 is a so-called free form surface design. In this the optical surfaces of at least three of the mirrors M1 to M6 are provided with so-called free form surfaces. This type of free form surface 26 is illustrated as an example in FIG. 4. Within the framework of this application a free form surface is understood to be a surface which is not rotationally symmetrical, and deviates at at least one point from every rotationally symmetrical surface by at least the wavelength λ of the imaging radiation 19. In particular, in relation to every rotationally symmetrical surface, in particular in relation to a best-adapted rotationally symmetrical reference surface 28 or a best-adapted spherical reference surface, the surface 26 has a two-dimensional surface deviation which has a difference between its greatest elevation and its deepest valley of at least λ. According to one embodiment according to the disclosure this difference is 10λ, 30λ, 50λ or greater. In the following, these deviations of the surfaces from rotational symmetry are also called asphericities. The term "asphericity" is often used in a narrower sense in which only a deviation from the spherical shape is meant. In this case, however, the term "asphericity" should also include deviations from rotational symmetry.

In the embodiment according to FIG. 5 all of the mirrors M1 to M6 are provided with free form surfaces 26. Here respective deviations of the latter from rotationally symmetrical reference surfaces are formed such that the asphericities cancel each other out in the entire optical system 10. Here "cancel" is to be understood in that the optical effects, which are generated by the single asphericities, respectively, supplement each other collectively to a correction of the wavefront, which correction is small compared to the respective correction effect of the single asphericities. In other words: The superimposed optical effects fall below a prespecified maximum deviation from a spherical wave. In the free form surface design according to FIG. 5 a single element compensating the asphericity of this non-rotationally symmetrical mirror is not assigned to any of the non-rotationally symmetrical mirrors M1 to M6. This is in contrast, for example, to an Alvarez manipulator or to a cylinder compensator wherein a combination of a positive or a negative cylinder lens, as described for example in EP 0 660 169 A1, is provided. As already mentioned above, according to FIG. 5 all of the mirrors M1 to M6 are designed as regards their asphericity such that the non-rotationally symmetrical image errors of the entire optical system 10 caused by the respective deviation of the mirrors from rotational symmetry are compensated. In other words, the asphericity of each mirror M1 to M6 is respectively compensated by the overall asphericity of all of the respectively remaining mirrors.

For each of the mirrors M1 to M6 a sup-aperture diameter is defined. The latter is given by the maximum diameter of a respective surface which is illuminated upon imaging any, but specifically chosen, point of the object field 13 on the corresponding mirror. For the purpose of illustration, in FIG. 5 the sub-aperture diameters $d_1^{SA}$ and $d_2^{SA}$ of the two mirrors M1 and M2 are drawn in which identify the diameters of the surfaces illuminated by a point $O_1$ of the object field 13 on the mirrors. Here the beam path $18_1$ of the imaging radiation passing from $O_1$ to the mirror M1 is marked specially by broken lines. The sub-aperture diameter $d^{SA}$ can vary from point to point of the object field 13.

Furthermore, for each of the mirrors M1 to M6 an optically free diameter $d^{CA}$ is defined. The latter is given by the diameter of the smallest circle around a respective reference axis of the corresponding mirror which contains the part of the respective mirror illuminated when imaging the entire object field 13. The respective reference axis is the axis of symmetry with rotationally symmetrical mirror surfaces. With non-rotationally symmetrical mirror surfaces the reference axis is the axis of symmetry of a rotationally symmetrical portion of the surface or the axis of symmetry of a best-adapted rotationally symmetrical reference surface. The reference axis is typically parallel to a normal onto the image plane.

In other words, the optically free diameter $d^{CA}$ is the maximum diameter of the illuminated portion of the mirror surface when imaging all points of the object field 13 through the beam path when the mirror in question is centrally illuminated. With peripheral illumination the minimum diameter of a mirror surface which fully contains the peripherally illuminated section is used. All of the mirrors M1 to M6 shown in FIG. 5 are illuminated more or less peripherally. The surfaces of the mirrors M1 to M6 respectively illustrated in the figure are decisive surfaces for determining the free diameters $d^{CA}$. For the purpose of illustration the respective free diameter $d_1^{CA}$ or $d_2^{CA}$ for the mirrors M1 and M2 is also drawn in.

By forming a quotient, a so-called sub-aperture ratio is calculated from the sub-aperture diameter $d^{SA}$ and the optically free diameter $d^{CA}$ for each of the mirrors M1 to M6. The sub-aperture ratio can also vary from object point to object point within a mirror. For the exemplary embodiment shown in FIG. 5 this variation within a mirror is negligibly slight. Table 1 below shows the sub-aperture ratios $d^{SA}/d^{CA}$ produced for the individual mirrors M1 to M6. Furthermore, the sub-aperture ratios in the object plane 12, the image plane 14 and the pupil plane 20 are also specified.

TABLE 1

| Position | Sub-aperture ratio $d^{SA}/d^{CA}$ |
| --- | --- |
| Object plane | 0.000 |
| Mirror M1 | 0.264 |
| Mirror M2 | 0.470 |
| Pupil plane | 1.000 |
| Mirror M3 | 0.351 |
| Mirror M4 | 0.230 |
| Mirror M5 | 0.620 |
| Mirror M6 | 0.748 |
| Image plane | 0.000 |

As can be seen from Table 1, the sub-aperture ratio of each of the mirrors M1 to M6 deviates considerably from the sub-aperture ratios of the respectively remaining mirrors. The smallest deviation is between the mirrors M1 and M4. However, the deviation here is still greater than 0.03. The design of the optical system 10 is formed such that the deviation at at least one point of the object field 13, in particular at each point of the object field 13, is at least 0.01. In contrast to this, the Alvarez manipulators described above, matched to one another in pairs, have smaller deviations in the sub-aperture ratio.

In the exemplary embodiment according to FIG. 5 the mirrors M3 and M4 for manipulating the wavefront of the optical system 10 are disposed rotatably in relation to a reference axis 30 perpendicular to the image plane 14, as indicated by the double arrows 32 and 34. In the drawing the reference axis is disposed in the z direction. Therefore the mirrors M3 and M4 can be displaced respectively in relation to the other mirrors with regard to their rotation position. In other embodiments of the optical system 10, alternatively or in addition, one or more optical elements can also be mounted displaceably in their position or tiltably relative to the reference axis 30.

As already mentioned above, all of the mirrors M1 to M6 have non-rotationally symmetrical surfaces. The topography of a non-rotationally symmetrical surface of this type can be illustrated by splitting into a rotationally symmetrical and a non-rotationally symmetrical portion. Here in principle the rotationally symmetrical portion can also be zero on all coordinates.

Figure 6:
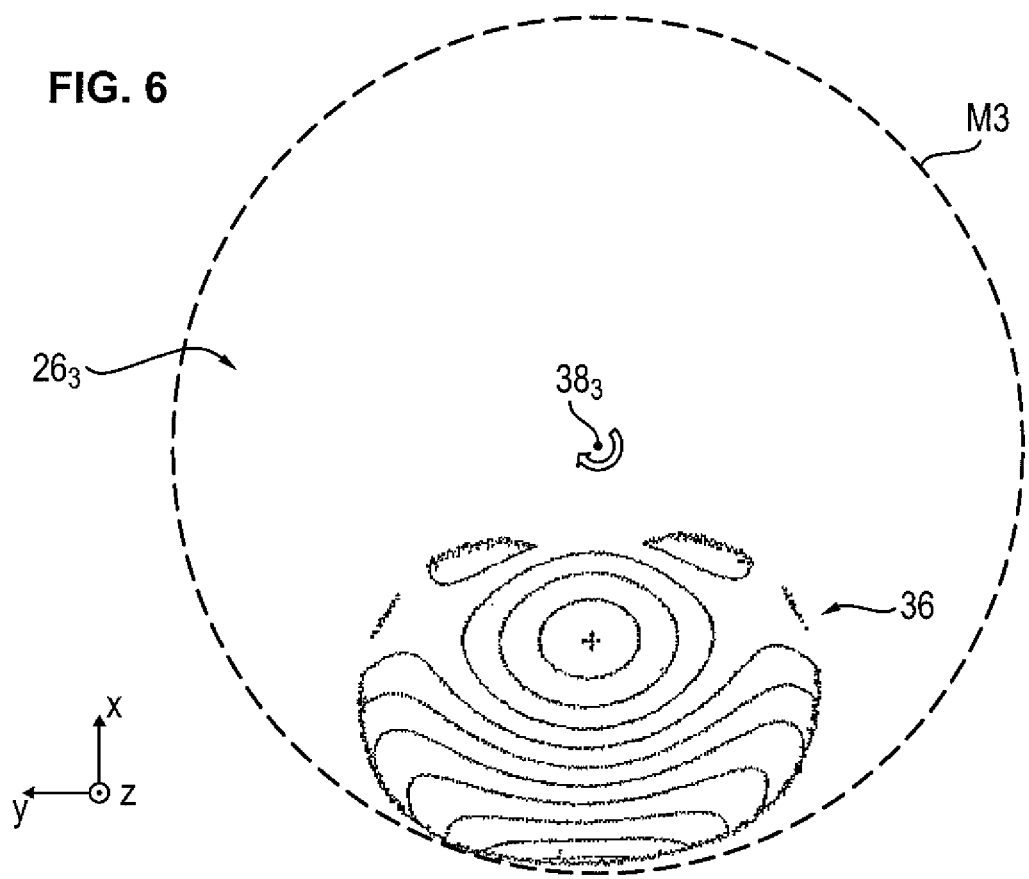
FIG. 6 a partial contour diagram of a non-rotationally symmetrical portion of the surface of the third mirror element of the projection objective of FIG. 5.
Figure 7:
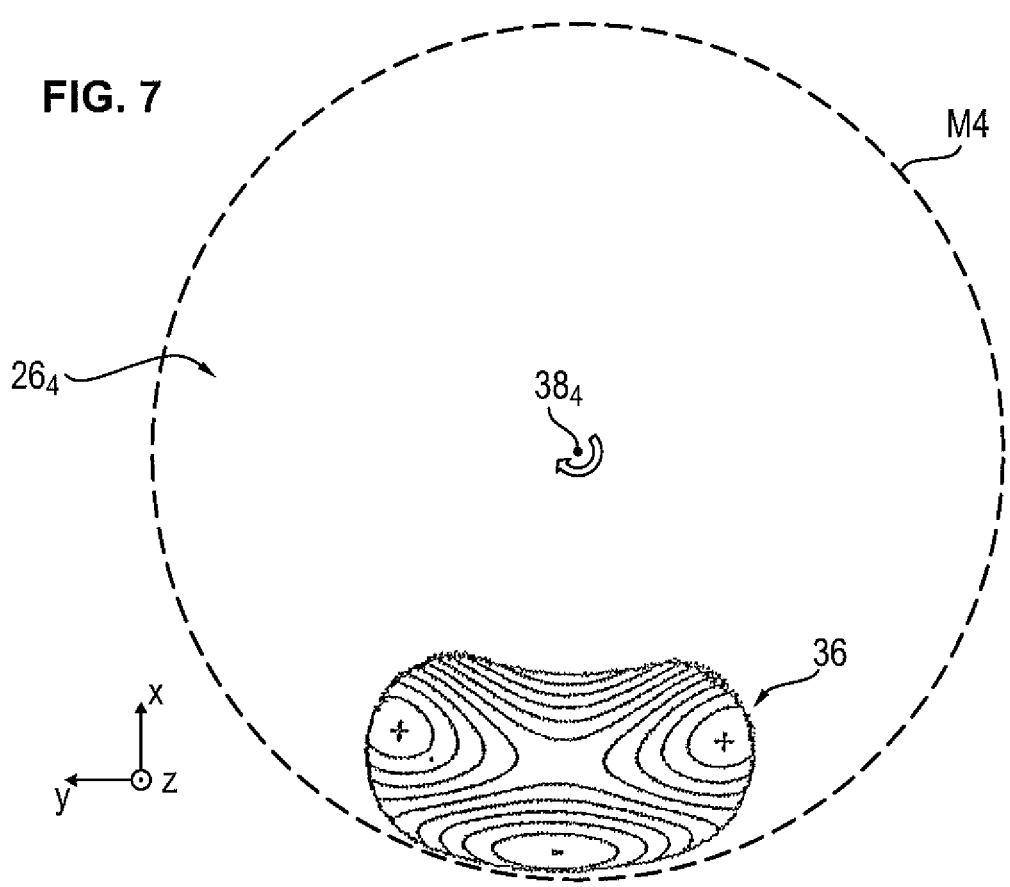
FIG. 7 a partial contour diagram of a non-rotationally symmetrical portion of the surface of the fourth mirror element of the projection objective of FIG. 5.

FIGS. 6 and 7 show contour diagrams of the non-rotationally symmetrical portions of the surfaces of the mirrors M3 and M4 of the optical system 10 according to FIG. 5 disposed rotatably for the purpose of manipulation. The respective optically used region is identified by reference number 36.

The surface topography of the optically used regions 36 on the mirrors M3 and M4 respectively has 2-fold symmetry in the lowest order. K-fold symmetry is basically to be understood as meaning that k is the largest natural number, for which the surface topography remains unchanged or is conveyed into itself when rotating the mirror in question in relation to an axis of rotation by the angle 360°/k. With the mirrors M3 and M4 the axis of rotation in question $38_3$ or $38_4$ lies outside of the respective used region 36. In case of rotation of the respective mirror M3 or M4 in relation to the axis of rotation in question $38_3$ or $38_4$ about an angle of 180° defining the 2-fold symmetry, the contoured region 36 would before its rotation have no overlap with the contoured region rotated by 180°. Therefore, the 2-fold symmetry in relation to the mirrors M3 and M4 is characterized via an alternative definition or one extended with respect to the above definition.

According to this definition a surface topography $z(x,y)$, with $(x, y) \in A \subset R^2$, extending over the x-y plane $R^2$ is k-waved or k-fold (with $k \in N$, N=set of natural numbers) if the following differential equation is fulfilled:

$$\left(\frac{\partial^2}{\partial \phi^2} + k^2\right) z(r\cos\phi, r\sin\phi) = 0 \quad (2)$$

for all $(x,y) \in A$ und $(x+r \cos \Phi, y+r \sin \Phi) \in A$ wherein $(r \cos \Phi, r \sin \Phi)$ are the polar coordinates for the point $(x, y)$.

The definition according to (2) applies independently of whether the surface $z(x,y)$ includes the z-axis acting as the axis of rotation. The optically used regions 36 of the mirrors M3 and M4 from FIGS. 6 and 7 respectively have according to this definition a 2-fold symmetry in relation to the corresponding axis of rotation $38_3$ or $38_4$.

Moreover, the surface topography in FIGS. 6 and 7 has mirror symmetry in relation to the xz plane. This mirror symmetry is shown with all of the surfaces of the optical system 10 according to FIG. 5, and so the optical system as a whole is also mirror-symmetrical.

Rotation of one of the two mirrors M3 and M4 or of both mirrors in relation to the reference axis $38_3$ or $38_4$ means a 2-fold disturbance u of the whole imaging optical system 10. The disturbance u due to the mirror rotation or generally due to displacement of at least one optical element brings about a wavefront change $W_u(x,y,p,q)$ in the extended four-dimensional pupil space, where $(x,y,p,q)=t$ according to equation (1).

Figure 10:
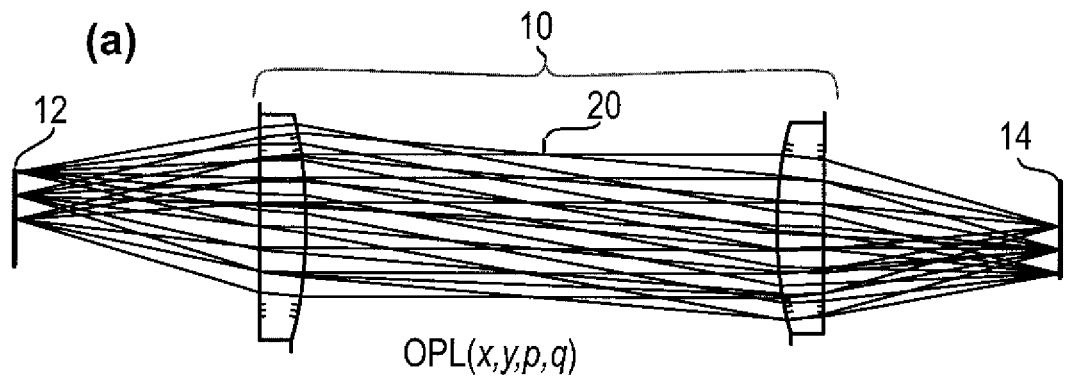
FIG. 10 an illustration of the beam path of a disturbed and an undisturbed optical system.
Figure 10:
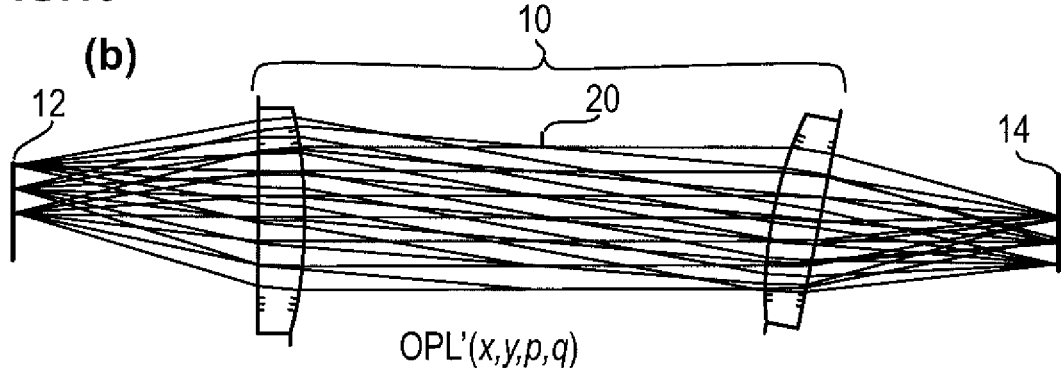

In order to give a general illustration of the concept of the wavefront change $W_u$, FIG. 10 shows under (a) the beam path of an optical system 10 without disturbance which is shown here via two optical lenses. The optical path length OPL from the object plane 12 through the optical system 10 to the image plane 14 is a function of the image field coordinates (x,y) and of the pupil coordinates (p,q). If disturbance u is now introduced into the optical system 10, as illustrated under (b) by tilting the second optical lens, the optical path length (OPL') changes. The difference between the path length OPL' (x,y,p,q) of the system with disturbance and the path length OPL(x,y,p,q) of the system without disturbance is the wavefront change W (x,y,p,q).

A disturbance is called k-fold and has k-fold symmetry when k is the largest natural number, so that after a rotation of the optical system 10 by $\Phi_k = 2\pi/k$ the wavefront change $W_u$ is conveyed into itself:

$$Wu(t') = Wu(t) \text{ mit } t' = \mathcal{R}_{\theta_k} t \text{ and} \tag{3}$$

$$\mathcal{R}_{\theta_k} = \begin{pmatrix} R_{\theta_k} & 0 \\ 0 & R_{\theta_k} \end{pmatrix} = \begin{pmatrix} \cos\phi_k & -\sin\phi_k & 0 & 0 \\ \sin\phi_k & \cos\phi_k & 0 & 0 \\ 0 & 0 & \cos\phi_k & -\sin\phi_k \\ 0 & 0 & \sin\phi_k & \cos\phi_k \end{pmatrix} \tag{4}$$

If the wavefront W does not change upon rotation by any arbitrary angle θ, i.e. when the disturbance u is rotationally symmetrical, one then also talks of disturbance with 0-fold symmetry.

Applied to the 2-fold disturbance produced by mirror rotation in the embodiment of the optical system 10 according to FIG. 5 this produces:

$$R_{\Theta_k} = R_\pi = \begin{pmatrix} -1 & 0 & 0 & 0 \\ 0 & -1 & 0 & 0 \\ 0 & 0 & -1 & 0 \\ 0 & 0 & 0 & -1 \end{pmatrix} \tag{4a}$$

For k≠0 a k-fold disturbance v belongs to every k-fold disturbance u which disturbance v is rotated by the angle $\theta_k/2 = \pi/(2k)$ relative to the disturbance u. The disturbances u and v are linearly independent upon the basis of k≠0 in the extended pupil space. Even with regard to the scalar product $$\frac{1}{\pi^2} \int W_u W_v$$

they are orthonormal to one another, the integration in the position and pupil space respectively extending over the unit circle. The phase space vector was standardized here to maximum field height and maximum numerical aperture. The wavefront change for disturbances with small disturbance amplitude and any intermediate angle θ then reads in linear approximation $$W_{u\theta}(t) = \cos(k\theta)W_u(t) + \sin(k\theta)W_v(t). \tag{5}$$

In the following $R_\alpha$ is defined like $R_{\phi_\alpha}$ in (4). With a coordinate transformation, which rotates both the wavefront change and the disturbance by the angle α, the wavefront does not change:

$$W_{u\theta+\alpha}(\mathcal{R}_\alpha t) = W_{u\theta}(t) b.z.w. W_{u\theta}(\mathcal{R}_\alpha t) = W_{u\theta-\alpha}(t) \tag{6}$$

and so:

$$\begin{pmatrix} W_u(\mathcal{R}_\alpha t) \\ W_v(\mathcal{R}_\alpha t) \end{pmatrix} = \begin{pmatrix} W_{u-\alpha}(t) \\ W_{u\pi/(2k)-\alpha}(t) \end{pmatrix} = R_{k\alpha} \begin{pmatrix} W_u(t) \\ W_v(t) \end{pmatrix} \tag{7}$$

This transformation behaviour is generalized in a trivial way for rotationally symmetrical disturbances with k=0. The generalization to negative values of k is just as easy. Here negative values correspond to a disturbance v which has been rotated in the opposite direction with regard to u (and in comparison to a positive k). Therefore, the "-fold" of the disturbances u and v is |k|.

The Zernike functions known to the person skilled in the art e.g. from section 13.2.3 of the text book "Optical Shop Testing", $2^{nd}$ Edition (1992) by Daniel Malacara, published by John Wiley & Sons, Inc. are defined in polar coordinates by:

$$Z_n^m(\rho, \phi) = R_n^m(\rho)\cos(m\phi) \tag{8}$$
$$Z_n^{-m}(\rho, \phi) = R_n^m(\rho)\sin(m\phi)$$
für $\rho, \phi \in \mathbb{R}, m, n, \in \mathbb{N}_0$ und $0 \le m \le n$
with $$R_n^m(\rho) == \tag{9}$$

$$\begin{cases} \sum_{k=0}^{(n-m)/2} \frac{(-1)^k(n-k)!}{k!((n+m)/2-k)!((n-m)/2-k)!} \rho^{n-2k} & \text{for } n-m \text{ even} \\ 0 & \text{otherwise} \end{cases}$$

One can easily convince oneself that the functions $Z_n^{\pm m}$ defined above at the cross-over from polar coordinates into Cartesian coordinates $x=\rho \cos \Phi$ and $y=\rho \sin \varphi$ change into polynomials of the Cartesian coordinates. The Zernike polynomials form an orthonormal function system on the unit circle with the scalar product $$\langle f, g \rangle = \frac{1}{2\pi} \int_0^{2\pi} d\phi \int_0^1 d\rho \rho f(\rho, \phi) g(\rho, \phi) \tag{10}$$

The transformation behaviour with rotations is given by $$Z_n^0(R_\alpha(x, y)) = Z_n^0(x, y) \text{ for } m = 0 \text{ and} \tag{11}$$

$$\begin{pmatrix} Z_n^m(R_\alpha(x, y)) \\ Z_n^{-m}(R_\alpha(x, y)) \end{pmatrix} = \begin{pmatrix} \cos(m\alpha)Z_n^m(x, y) - \sin(m\alpha)Z_n^{-m}(x, y) \\ \sin(m\alpha)Z_n^m(x, y) + \cos(m\alpha)Z_n^{-m}(x, y) \end{pmatrix}$$

for $m > 0$

The Zernike functions $Z_m^n$ specified above can also be designated in the so-called fringe sorting by $Z_j$, $c_j$ then being the Zernike coefficients assigned to the respective Zernike functions. The fringe sorting is illustrated, for example, in Table 20-2 on page 215 of the "Handbook of Optical Systems", Vol. 2 by H. Gross, 2005 Wiley-VCH Verlag GmbH & Co. KgaA, Weinheim. The wavefront deviation W(,Φ) at a point in the object plane 12 is then developed as follows:

$$W(\rho, \Phi) = \sum_j c_j \cdot Z_j(\rho, \Phi) \tag{12}$$

For the sake of simplicity, here also W was used for designation of the wavefront, although the present relates, in contrast to (1), only to the pupil. Whereas the Zernike functions are designated by $Z_j$, i.e. with the subscript index j, in the following the Zernike coefficients $c_j$ are also designated, as is customary in the specialist world, by $Z_j$, i.e. with a normally written index, such as for example Z5 and Z6 for astigmatism.

The surfaces $26_3$ and $26_4$ of the mirrors M3 and M4 according to FIG. 6 and FIG. 7 are formed with such non-rotationally symmetrical portions that the wavefront change $W_u(x,y,p,q)$ caused by rotation of at least one of the mirrors has an extremal value, the absolute value of which is at least $1 \times 10^{-5}$ of the wavelength λ, and for λ=13.5 nm this is at least 0.135 pm. If $W_a(x, y, p, q)$ is the wavefront before the rotation, and $W_d(x, y, p, q)$ is the wavefront after the rotation of the at least one mirror, the following applies:

$$\max_{x,y \in B} \max_{p,q \in P} |W_a(x, y, p, q) - W_d(x, y, p, q)| \geq 1 \cdot 10^{-5} \cdot \lambda \tag{13}$$

where B indexes the points of the image field, and P the points of the pupil.

Figure 8:
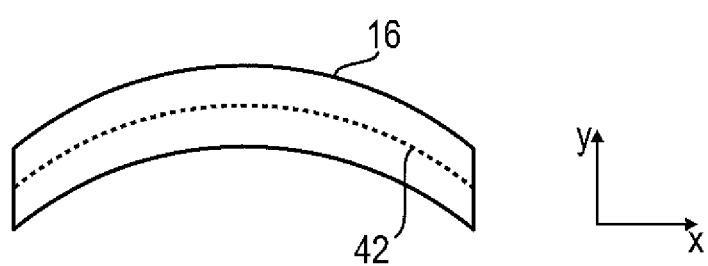
FIG. 8 the shape of the image field of the projection objective according to FIG. 5.
Figure 9:
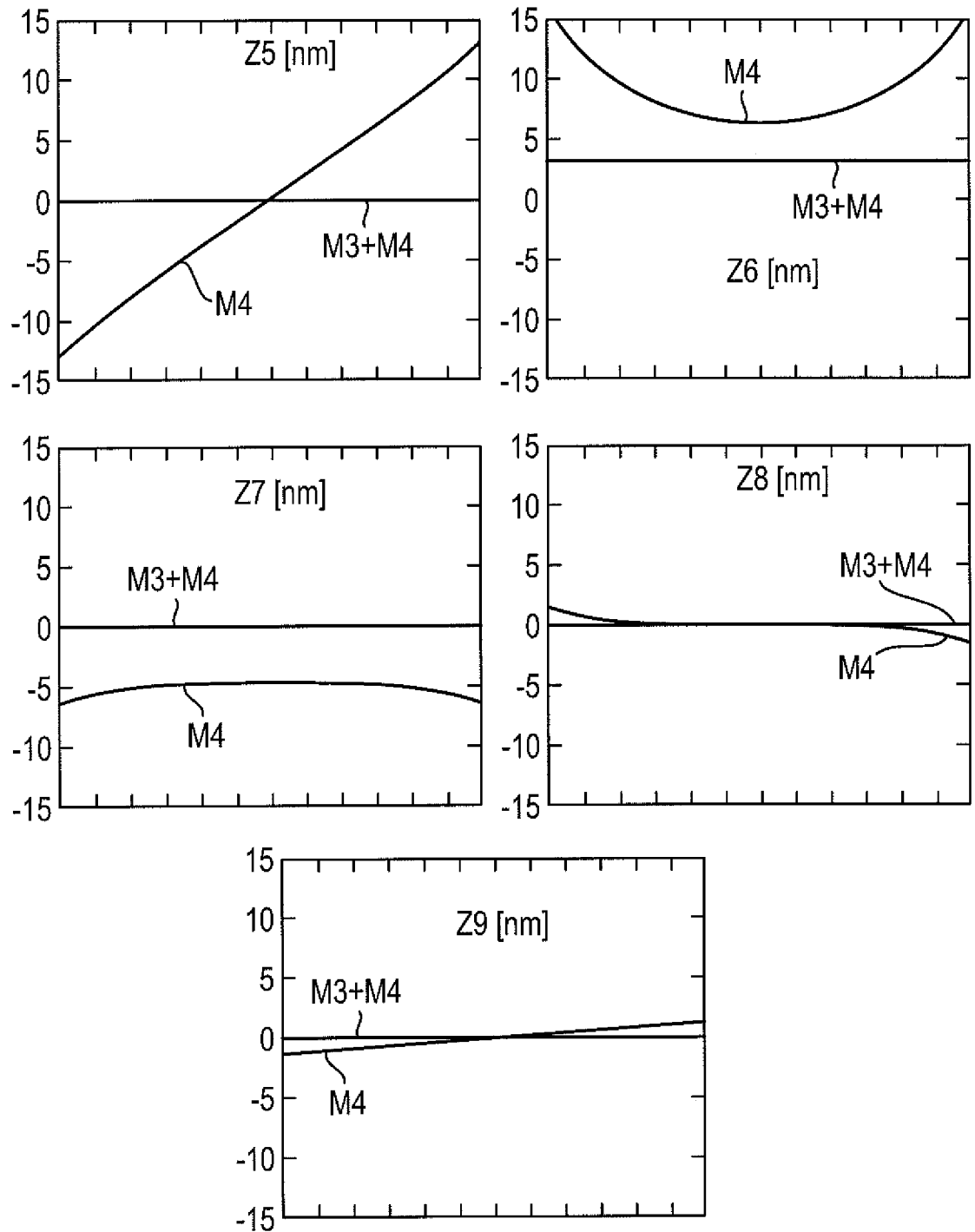
FIG. 9 the effects of rotation of the fourth and of the third and fourth mirror upon specific image errors.

FIG. 9 shows the effect of the disturbance u along a circle segment 42 shown in FIG. 8 brought about by mirror rotation in the optical system 10 according to FIG. 5, the circle segment extending within the image field 16 in the present case being in the form of a ring segment. The effects shown in FIG. 9 relate to Zernike coefficients Z5 and Z6 (astigmatism), Zernike coefficients Z7 and Z8 (coma) and Zernike coefficient Z9 (spherical aberration) in the expansion of the aberration in the pupil on the basis of the Zernike polynomials. The deviations of the aforementioned Zernike coefficients along the circle segment 42 are respectively shown here on the one hand for a rotation of just the mirror M4, and on the other hand for a rotation of both mirrors M3 and M4. When rotating the two mirrors M3 and M4, the rotation is implemented in a fixed and suitably chosen transformation ratio.

As can be gathered from the diagrams of FIG. 9, when rotating the mirror M4 there is high sensitivity with regard to Z5, Z6 and Z7. Rotation of both mirrors M3 and M4 with the aforementioned transformation ratio offers the possibility of manipulating the Zernike coefficient Z6 separately with a constant effect over the image field. As can be seen from FIG. 9, Zernike coefficients Z5, Z7, Z8 and Z9 do not change here, or only change insignificantly, whereas Z6 changes constantly over the whole image field. Therefore the embodiment of the optical system 10 according to FIGS. 5 to 7 includes a roughly pure Z6 astigmatism manipulator.

With the embodiment according to the disclosure of an imaging optical system 10 described above with reference to FIG. 5, as already explained above, the surfaces of the mirrors M5 and M6 are configured such that by rotating one of the aforementioned mirrors, a wavefront change $W_u$ of the optical system 10 with 2-fold symmetry can be produced.

Moreover, the imaging optical system 10 can be configured in a plurality of different embodiments according to the disclosure. These embodiments all satisfy the condition that the surface of one of the optical elements with a non-rotationally symmetrical surface of the optical system is configured such that by displacing this optical element relative to the other optical elements a change $W_u$ to the wavefront, that cannot be brought about by displacement of a rotationally symmetrical optical element, can be produced. The maximum value of the wavefront change $W_u$ (x, y, p, q) is at least $1 \times 10^{-5}$ of the wavelength λ here. Displacement of the optical element can be brought about for example by rotation, shifting or tilting of the element. For this purpose the optical system 10 has appropriate actuators.

In other words, by displacing the non-rotationally symmetrical optical element one can produce wavefront changes which cannot be produced by displacement of a rotationally symmetrical optical element. An example of this is the wavefront change with 2-fold symmetry which can be produced via the embodiment according to FIG. 5.

In order to define precisely all of the wavefront changes that can be produced via the embodiments according to the disclosure, in the following all of the wavefront changes that can be produced by displacement of a rotationally optical element will first of all be identified.

For this purpose the wavefront change $W_{u_\theta}$ brought about by a disturbance $u_\theta$ with k-fold symmetry (θ=2π/k) is first of all clearly broken down into the following orthonormal function system from products of location Zernike functions $Z_n^m$ (x, y) and pupil Zernike functions $Z_{n'}^{m'}$(p, q):

$$W_{u_\theta}(x, y, p, q) = \sum_{n,n'=0}^{\infty} \sum_{\substack{m,m'=-n,-n' \\ n-m, n'-m' \text{ even}}}^{n,n'} w_{n,m,n',m'} Z_n^m(x, y) Z_{n'}^{m'}(p, q). \tag{14}$$

New base functions are now defined which are better adapted to the k-fold symmetry of the disturbance $u_\theta$:

$$A_{n,n'}^{m,m'}(x,y,p,q) = Z_n^m(x,y)Z_{n'}^{m'}(p,q) + Z_n^{-m}(x,y)Z_{n'}^{-m'}(p,q)$$

$$B_{n,n'}^{m,m'}(x,y,p,q) = Z_n^{-m}(x,y)Z_{n'}^{m'}(p,q) - Z_n^m(x,y)Z_{n'}^{-m'}(p,q)$$

$$C_{n,n'}^{m,m'}(x,y,p,q) = Z_n^m(x,y)Z_{n'}^{m'}(p,q) - Z_n^{-m}(x,y)Z_{n'}^{-m'}(p,q)$$

$$D_{n,n'}^{m,m'}(x,y,p,q) = Z_n^{-m}(x,y)Z_{n'}^{m'}(p,q) + Z_n^m(x,y)Z_{n'}^{-m'}(p,q) \tag{15}$$

where m, m'≥0. The index m without a dash specifies the waviness in the field, and the index m' with a dash the waviness in the pupil. The following now applies:

$$W_{u_\theta}(x, y, p, q) = {}^a 0, 0, 0, 0\, A_{0,0}^{0,0}(x, y, p, q) + \sum_{n,n'=0}^{\infty} \sum_{\substack{m'=1 \\ n,n'-m' \text{ even}}}^{n'} {}^a n, \tag{16}$$

$$0, n', m'\, A_{n,n'}^{0,m'}(x, y, p, q) + {}^b n, 0, n',$$

-continued $$m' B_{n,n'}^{0,m'}(x, y, p, q) + \sum_{n,n'=0}^{\infty} \sum_{\substack{m'=1 \\ n-m,n' \text{ even}}}^{n} a_{n},$$

$$m, n', 0 \; A_{n,n'}^{m,0}(x, y, p, q) + {}^b n, m, n',$$

$$0 \; B_{n,n'}^{m,0}(x, y, p, q) + \sum_{n,n'=0}^{\infty} \sum_{\substack{m,m'=1,1 \\ n-m,n'-m' \text{ even}}}^{n,n'} a_{n, m, n'},$$

$$m' A_{n,n'}^{m,m'}(x, y, p, q) + {}^b n, m, n', m' B_{n,n'}^{m,m'}(x, y, p, q) + {}^c n,$$

$$m, n', m' C_{n,n'}^{m,m'}(x, y, p, q) + {}^d n, m, n', m' D_{n,n'}^{m,m'}(x, y, p, q)$$

with $${}^a n, m, n', m' = (w_{n,m,n',m'} + w_{n,-m,n',-m'})/2$$

$${}^b n, m, n', m' = (w_{n,-m,n',m'} + w_{n,m,n',-m'})/2$$

$${}^c n, m, n', m' = (w_{n,m,n',m'} - w_{n,-m,n',-m'})/2$$

$${}^d n, m, n', m' = (w_{n,-m,n',m'} - w_{n,m,n',-m'})/2$$

and $$w_{n,m,n',m'} = a_{n,m,n',m'} + c_{n,m,n',m'}$$

$$w_{n,-m,n',-m'} = a_{n,m,n',m'} - c_{n,m,n',m'}$$

$$w_{n,-m,n',m'} = b_{n,m,n',m'} + d_{n,m,n',m'}$$

$$w_{n,m,n',-m'} = b_{n,m,n',m'} - d_{n,m,n',m'}$$

The new function basis shows the following simple transformation behaviour with rotations by the angle $\alpha$:

$$\begin{pmatrix} A_{n,n'}^{m,m'}(\mathcal{R}_\alpha t) \\ B_{n,n'}^{m,m'}(\mathcal{R}_\alpha t) \end{pmatrix} = R_{k_1\alpha} \begin{pmatrix} A_{n,n'}^{m,m'}(t) \\ B_{n,n'}^{m,m'}(t) \end{pmatrix} \; k_1 = m - m' \quad (17)$$

and $$\begin{pmatrix} C_{n,n'}^{m,m'}(\mathcal{R}_\alpha t) \\ D_{n,n'}^{m,m'}(\mathcal{R}_\alpha t) \end{pmatrix} = R_{k_2\alpha} \begin{pmatrix} C_{n,n'}^{m,m'}(t) \\ D_{n,n'}^{m,m'}(t) \end{pmatrix} \text{ with } k_2 = m + m'.$$

Therefore the functions $(A_{n,n'}^{m,m'}, B_{n,n'}^{m,m'})$ transform such as $(W_u, W_v)_r$-wave disturbance, and $(C_{n,n'}^{m,m'}, D_{n,n'}^{m,m'})$ such as $(W_u, W_v)$ with a $k_2$-wave disturbance.

From the transformation behaviour of the symmetry-adapted function system there follows for the corresponding expansion coefficients $$a_{n,n'}^{m,m'}, b_{n,n'}^{m,m'}, c_{n,n'}^{m,m'}, \text{ und } d_{n,n'}^{m,m'}, m = 0 \ldots$$
$$n, m' = 0 \ldots n'$$

the following selection rules generally applicable to rotationally symmetrical and non-rotationally symmetrical optical elements:

i) for 0-wave disturbances $$a_{n,n'}^{m,m'} = b_{n,n'}^{m,m'} = 0 \text{ for } m \neq m'$$

$$c_{n,n'}^{m,m'} = d_{n,n'}^{m,m'} = 0 \quad (18)$$

(ii) for 1-wave disturbances $$a_{n,n'}^{m,m'} = b_{n,n'}^{m,m'} = 0 \text{ for } m \neq m' \pm 1$$

$$c_{n,n'}^{m,m'} = d_{n,n'}^{m,m'} = 0 \quad (19)$$

(iii) generally for k-wave disturbances $$a_{n,n'}^{m,m'} = b_{n,n'}^{m,m'} = 0 \text{ for } m \neq m' \pm k$$

$$c_{n,n'}^{m,m'} = d_{n,n'}^{m,m'} = 0 \text{ for } m \neq -m' \pm k \quad (20)$$

Proceeding from here, all of the wavefront changes which can be produced by displacement of a rotationally symmetrical optical element are now defined by selection rules. A distinction is made here in the displacement between:

a) a shift of the optical element along its axis of symmetry,
b) a shift of the optical element orthogonally to its axis of symmetry, and
c) tilting of the optical element about an axis orthogonally to its axis of symmetry.

A shift of the optical element along its axis of symmetry according to a) is a zero-wave disturbance which can be described as follows:

$$W_u(x,y,p,q)=$$

$a_{0,0,0,0} A_{0,0}^{0,0}(x,y,p,q)$+constant phase offset (no effect upon imaging)

$a_{1,1,1,1} A_{1,1}^{1,1}(x,y,p,q)$+scale error $b_{1,1,1,1} B_{1,1}^{1,1}(x,y,p,q)$+image field rotation (permitted error, but does not occur de facto), $a_{0,2,0,0} A_{0,2}^{0,0}(x,y,p,q)$+field constant Z4 (defocus)

$a_{2,0,0,0} A_{2,0}^{0,0}(x,y,p,q)$+quadratic phase offset (no effect upon imaging)

$a_{3,1,1,1} A_{3,1}^{1,1}(x,y,p,q)$+D3 $3^{rd}$-order distortion (cushion)

$a_{1,3,1,1} A_{1,3}^{1,1}(x,y,p,q)$+linear coma $b_{3,1,1,1} B_{3,1}^{1,1}(x,y,p,q)$+nameless (permitted distortion error which does not occur de facto)

$b_{1,3,1,1} B_{1,3}^{1,1}(x,y,p,q)$+nameless (permitted coma error which does not occur de facto) (21)

Terms with $m \neq m'$ and terms proportional to $C_{n,n'}^{m,m'}$ or $D_{n,n'}^{m,m'}$ do not occur.

The embodiments according to the disclosure can now be summarized as follows: The surface of one of the non-rotationally symmetrical optical elements of the optical system 10 is configured such that by displacing this optical element relative to the other optical elements, changes $W_u$ to the wavefront can be produced which do not include the wavefront changes mentioned under (19) and (20). These wavefront changes can be brought about by displacing a rotationally symmetrical optical element.

Wavefront changes $W_u$ that can be produced according to the disclosure by the non-rotationally symmetrical optical element cover all wavefront changes with 2-fold and higher number-fold symmetry, but if applicable also some wavefront changes with 1-fold symmetry.

A shift of the optical element orthogonally to its axis of symmetry according to b) and tilting of the optical element about an axis orthogonally to its axis of symmetry according to c) is a one-wave disturbance which can be described as follows:

$$W_u(x,y,p,q)=$$

$a_{1,0,1,0} A_{1,0}^{1,0}(x,y,p,q)$+linear phase offset (no effect upon imaging)

$b_{1,0,1,0} B_{1,0}^{1,0}(x,y,p,q)$+linear phase offset (not effect upon imaging)

$a_{0,1,0,1}A_{0,1}^{0,1}(x,y,p,q)$+field displacement in 45° direction $b_{0,1,0,1}B_{0,1}^{0,1}(x,y,p,q)$+field displacement in −45° direction $a_{2,1,0,1}A_{2,1}^{0,1}(x,y,p,q)$+D2 quadratic distortion $b_{2,1,0,1}B_{2,1}^{0,1}(x,y,p,q)$+D2 quadratic distortion $a_{1,2,1,0}A_{1,2}^{1,0}(x,y,p,q)$+Z4 tilt (tilt of the image plane)

$b_{1,2,1,0}B_{1,2}^{1,0}(x,y,p,q)$+Z4 tilt (tilt of the image plane)

$a_{1,2,1,2}A_{1,2}^{1,2}(x,y,p,q)$+linear astigmatism $b_{1,2,1,2}B_{1,2}^{1,2}(x,y,p,q)$+linear astigmatism $a_{2,1,2,1}A_{2,1}^{2,1}(x,y,p,q)$+D2 quadratic distortion $b_{2,1,2,1}B_{2,1}^{2,1}(x,y,p,q)$+D2 quadratic distortion $a_{0,3,0,1}A_{0,3}^{0,1}(x,y,p,q)$+field constant coma in 45° direction  (22)

Terms with $m \neq m' \pm 1$ and terms proportional to $C_{n,n'}^{m,m'}$ or $D_{n,n'}^{m,m'}$ do not occur.

As already mentioned above, the embodiment of the optical system 10 according to FIGS. 5 to 7 includes a manipulator, which is capable of producing a pure Z6, i.e. a Z6 which is not connected with other Zernike polynomials, and therefore addresses $2^{nd}$-order astigmatism. In the following an embodiment of an optical system is described which is used for the pure manipulation of Z12 and so of $4^{th}$-order astigmatism.

In terms of the new base functions (15) and coefficients (16) a k-fold symmetry of a portion of a general wavefront $W_u(x, y, p, q)$, following the expansion (16), is defined by the following terms:

A wavefront is the to be k-fold symmetric provided that $a_{n,n'}^{m,m'} = b_{n,n'}^{m,m'} = 0$ if $m' \neq m \pm k$ and $c_{n,n'}^{m,m'} = d_{n,n'}^{m,m'} = 0$ if $m' \neq -m \pm k$ A wavefront is the to be at least k-fold symmetric provided that there exists a natural number l such that $a_{n,n'}^{m,m'} = b_{n,n'}^{m,m'} = 0$ if $m' \neq m \pm lk$ and $c_{n,n'}^{m,m'} = d_{n,n'}^{m,m'} = 0$ if $m' \neq -m \pm lk$ A wavefront is the to be containing a portion of k-fold symmetry provided that $a_{n,n'}^{m,m'} \neq 0$ for at least one $m' = m \pm k$ or $b_{n,n'}^{m,m'} \neq 0$ for at least one $m' = m \pm k$ or $c_{n,n'}^{m,m'} \neq 0$ for at least one $m' = -m \pm k$ or $d_{n,n'}^{m,m'} \neq 0$ for at least one $m' = -m \pm k$ A wavefront is the to be containing a portion of at least k-fold symmetry provided that there exists a natural number l such that $a_{n,n'}^{m,m'} \neq 0$ for at least one $m' = m \pm lk$ or $b_{n,n'}^{m,m'} \neq 0$ for at least one $m' = m \pm lk$ or $c_{n,n'}^{m,m'} \neq 0$ for at least one $m' = -m \pm lk$ or $d_{n,n'}^{m,m'} \neq 0$ for at least one $m' = -m \pm lk$ According to this embodiment the optical system 10 includes an optical element close to the pupil in the form of a mirror element. In this context, close to the pupil means that the sub-aperture ratio $d^{SA}/d^{CA}$ of this mirror element is at least 0.9. The optical surface of this element close to the pupil has the following deviation from its rotationally symmetrical basic shape in the z direction, i.e. in the direction perpendicular to the image plane of the optical system:

$$z(x,y) = cZ13(x,y) \qquad (23)$$

Therefore the optical surface is 2-wave in shape. With a rotation of the element by δ in relation to the z axis this produces $$z(x \cdot \cos\delta + y \cdot \sin\delta, y \cdot \cos\delta - x \cdot \sin\delta) \approx \qquad (24)$$
$$z(x, y) + \delta \frac{\partial z(x + y \cdot d, y - x \cdot d)}{\partial d}\bigg|_{d=0} = z(x, y) + 2\delta c Z12(x, y)$$

The form change upon rotation of the surface is therefore 2-wave. Since the surface is, according to the desired properties, close to the pupil, the primary resulting image error is field constant and proportional to the form change, i.e.

$$W(x, y, p, q) = \gamma Z12(p, q) \qquad (25)$$
$$= \gamma Z1(x, y) Z12(p, q)$$
$$= \frac{\gamma}{2}(A_{0,4}^{0,2}(x, y, p, q) + B_{0,4}^{0,2}(x, y, p, q)),$$

and so $a_{0,4}^{0,2} = b_{0,4}^{0,2} = \gamma/2$. All others $a_{n,n'}^{m,m'}$, $b_{n,n'}^{m,m'}$, $c_{n,n'}^{m,m'}$, $d_{n,n'}^{m,m'}$ and so in particular those for $m \neq m' \pm k$ and $m \neq m' \pm k$ are 0.

In the following a further embodiment of the optical system 10 shown in FIG. 5 is described, wherein M2 has a Z16-type superposition form. In this embodiment the non-rotationally symmetrical portions of the surfaces 26 of the mirrors M1 to M6 are respectively characterized by the combination of a basic deviation from rotational symmetry and a non-rotationally symmetrical superposition form. The basic deviation is defined by the non-rotationally symmetrical portion of a basic shape g of the surface 26 in question. The basic shapes of the surfaces 26, in the following also designated as $O_n$, are determined by conventional design optimization of the optical system 10. The index n indicates the sequence number of the corresponding mirror M1 to M6. With this type of optimization, within the framework of the optical design the surface shapes are configured such that the optical system obtains desired optical properties. The desired optical properties can, for example, include the minimization of the whole wavefront deviation or of specific image errors.

The basic shapes $g_n(x, y)$ of the surfaces 26 of the mirrors M1 to M6 determined via optical design optimization are modified by superposition forms $s_n(x,y)$. The basic shapes include rotationally symmetrical portions and the aforementioned basic deviations from rotational symmetry. The modification with the superposition forms $s_n(x, y)$ already takes place within the framework of the optics design, i.e. the design data which represent the basic shapes $g_n(x, y)$ are modified by the superposition forms $s_n(x, y)$. The superposition forms $s_n(x, y)$ specify deviations of the mirror surfaces from the basic shapes $g_n(x, y)$ of the latter as a function of the coordinates x and y orthogonal to the reference axis 30.

The respective surface $O_n(x, y)$ is determined by addition of the respective basic shape $g_n(x, y)$ to the corresponding superposition form $s_n(x, y)$ as follows:

$$O_n(x,y)=g_n(x,y)+s_n(x,y) \quad (26)$$

As already specified above, according to the embodiment now being described, the surface $O_2(x, y)$ of the mirror M2 has a Z16-type superposition form $s_2(x, y)$, i.e. $s_2(x, y)$ is proportional to the Zernike function $Z_{16}$ ($\rho$, $\Phi$), modulo an adaptation to the diameter of the optically used region. According to one variant, in addition to a portion proportional to the Zernike function $Z_{16}$ ($\rho$, $\Phi$), the superposition form $s_2(x, y)$ has further portions which follow other distributions. The superposition form $s_2(x, y)$ is configured such that upon displacement of the mirror M2 configured with by the latter, a manipulation effect upon the wavefront error of the optical system 10 is brought about. Therefore the superposition form $s_2(x, y)$ is also called the manipulation form.

Within the framework of the design process the wavefront deviation introduced into the optical system 10 by the superposition form $s_2(x, y)$ is compensated as well as possible by applying superposition forms to the remaining mirrors M1, M3, M4, M5 and M6. The superposition forms $s_1(x, y)$, $s_3(x, y)$, $s_4(x, y)$, $s_5(x, y)$ and $s_6(x, y)$ thus applied are also called compensation forms due to the aforementioned function. If an amplitude, for example, of 75 nm is applied for the manipulation form $s_2(x, y)$, by providing manipulation forms on the remaining mirrors the wavefront error produced by $s_2$ can be pushed to a non-correctable RMS value of approximately 0.2 nm regarding the Zernike coefficients Z5 to Z37. Here the maxima with Zernike coefficients Z2 to Z8 are approximately 0.05 nm. In this case one obtains as a manipulator a fifth-order polynomial. This corresponds to the derivation of $Z_{16}$ in a spatial direction.

According to a further variant the manipulation form $s_2(x, y)$ has at least one portion which is proportional to the Zernike function $Z_{15}$ ($\rho$, $\Phi$). If an amplitude of 75 nm is also applied to this portion, by providing appropriate compensation forms to the remaining mirrors the wavefront error produced by the Z15-type portion can also be pushed to a non-correctable RMS value of approximately 0.2 nm regarding the Zernike coefficients Z5 to Z37. Here the maxima with Zernike coefficients Z2 to Z36 are smaller than 0.02 nm.

Figure 11:
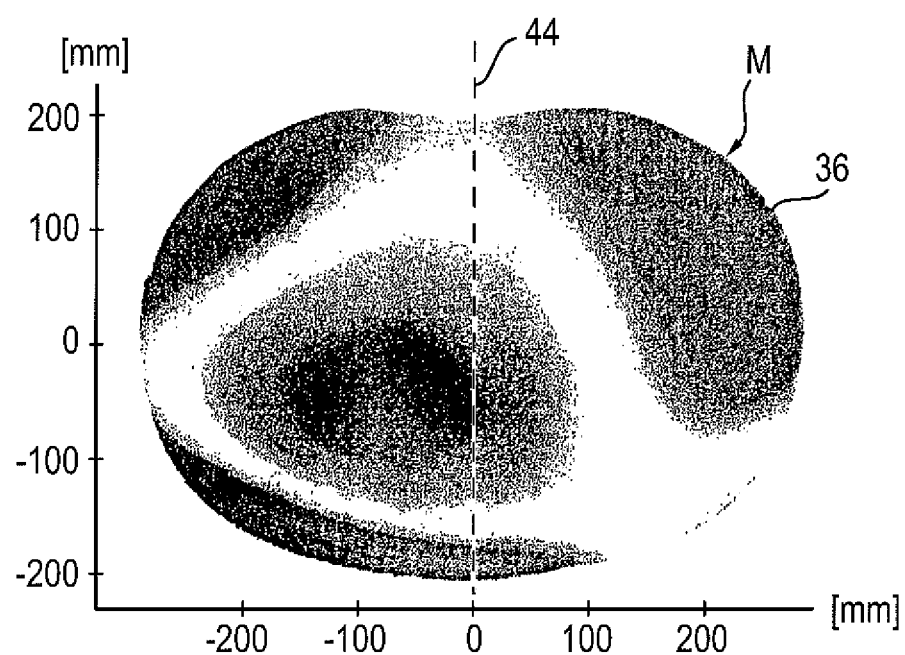
FIG. 11 a grayscale illustration of a height distribution of an optically used region of a mirror element of the projection objective according to FIG. 1 in a further embodiment according to the disclosure.

FIG. 11 shows the height profile of an optically used region 36 of a non-rotationally symmetrical surface of a mirror element M in a further embodiment according to the disclosure. In this embodiment the surface in the optically used region 36 has a deviation from the mirror symmetry. This deviation is displayed as follows: The used surface 36 deviates from every mirror-symmetrical surface in relation to an axis of symmetry 44, in particular from a mirror-symmetrical surface best-adapted to the surface 36, by at least $\lambda/10$. In advantageous embodiments the deviation is at least $\lambda/2$, in particular at least $\lambda$ or at least $10\lambda$. A distinction is made according to the disclosure between imaging optical systems 10 in embodiments wherein there are two or more optical elements having the aforementioned break in symmetry and embodiments with just one optical element having a break in symmetry, in this case the deviation from every mirror symmetrical surface in relation to the axis of symmetry 44 being at least $10\lambda$.

According to an aspect of the disclosure the aforementioned break in symmetry is already realized in the optical design. Therefore, according to the aspect of the disclosure, with the optical design one deviates from the conventional method. Differently to what has previously been customary, the optical design is no longer completed by mirroring a surface section calculated in the first design step; in fact the entire optically used region 36 is calculated within the framework of the design development. Using this method the design becomes more complex, and, if applicable, also worse in that from the design aspect, the entire optical system is assigned greater image errors, and at the same time the break in symmetry makes it possible to equip the optical element with particularly effective manipulator properties in accordance with the disclosure.

The deviation specified above of the surface region 36 of the completed optical element according to an embodiment of the disclosure from a mirror-symmetrical surface is greater than deviations which are achieved in a conventional manner via mirror-symmetrical design and subsequent mechanical processing. Therefore, the deviation according to the disclosure is not achieved, for example, by the method applied with intrinsically corrected aspheres, also known as ICAs, wherein the optical design supplies mirror-symmetrical data in the conventional way, the optical element is initially produced according to the optical design, and finally the mirror symmetry is broken by ion beam abrasion.

Figure 12:
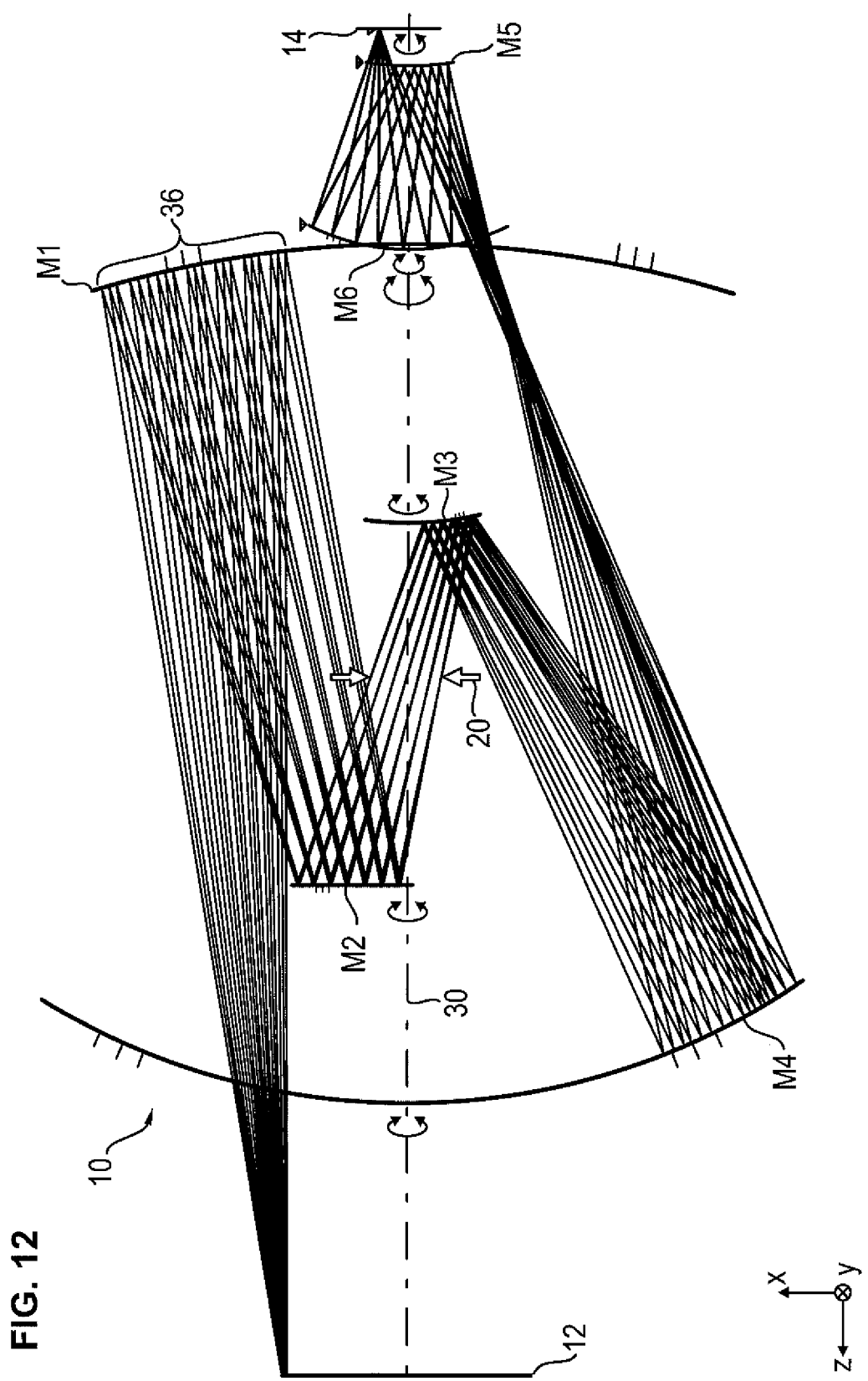
FIG. 12 a sectional view through a further exemplary embodiment of a projection objective according to FIG. 1 with six mirror elements.
Figure 13:
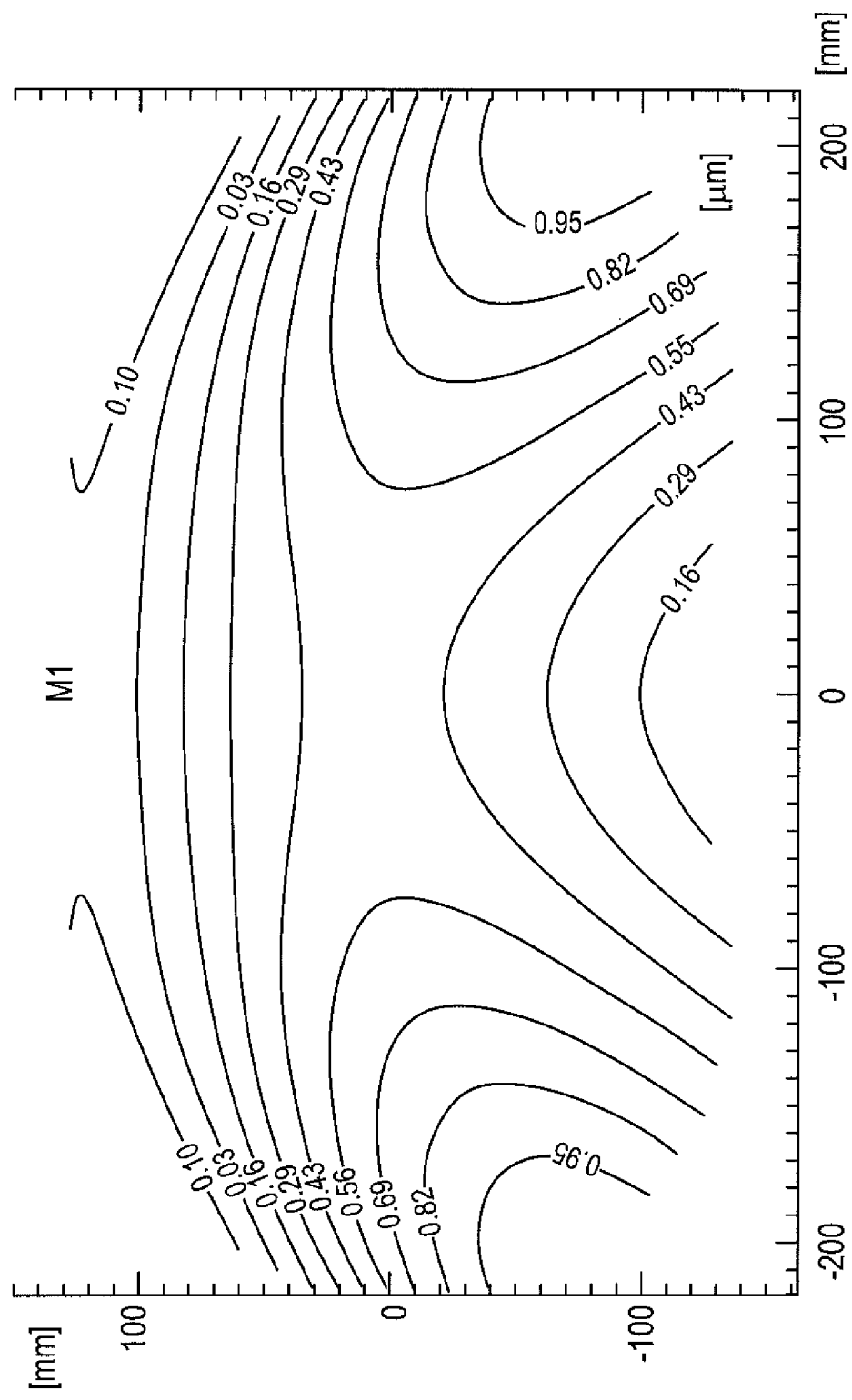
FIG. 13 a partial contour diagram of a non-rotationally symmetrical portion of the surface of the first mirror element of the projection objective of FIG. 12.
Figure 14:
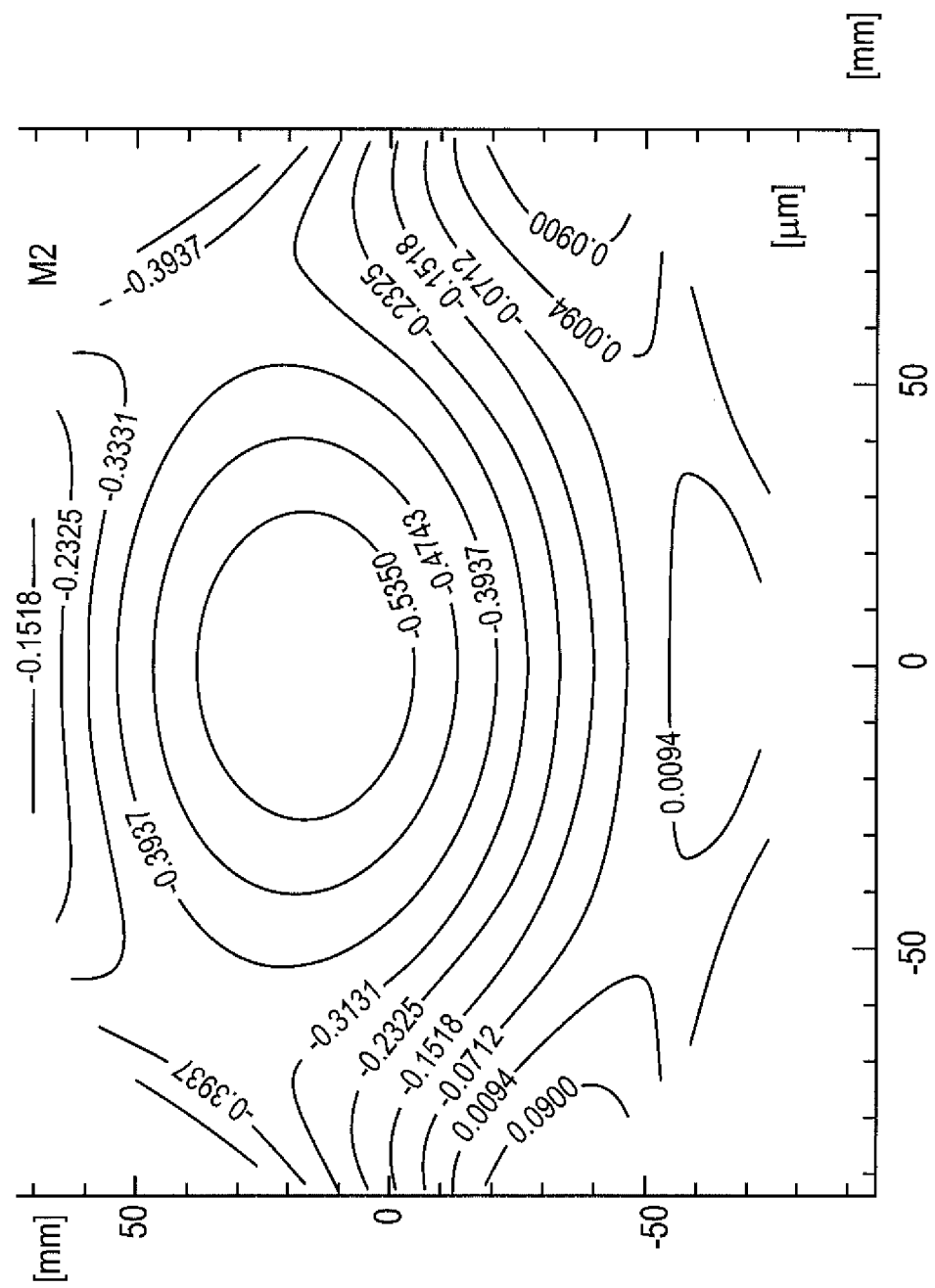
FIG. 14 a partial contour diagram of a non-rotationally symmetrical portion of the surface of the second mirror element of the projection objective of FIG. 12.
Figure 15:
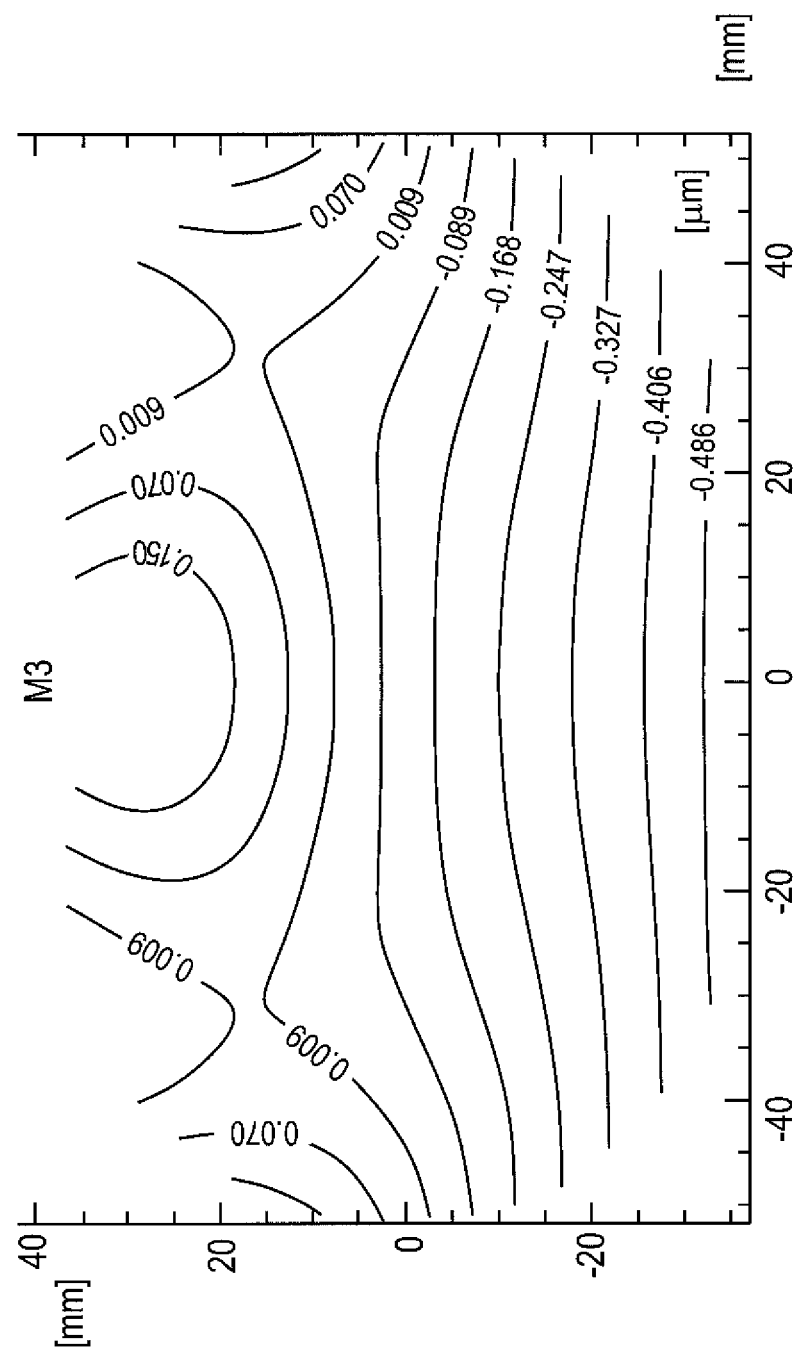
FIG. 15 a partial contour diagram of a non-rotationally symmetrical portion of the surface of the third mirror element of the projection objective of FIG. 12.
Figure 16:
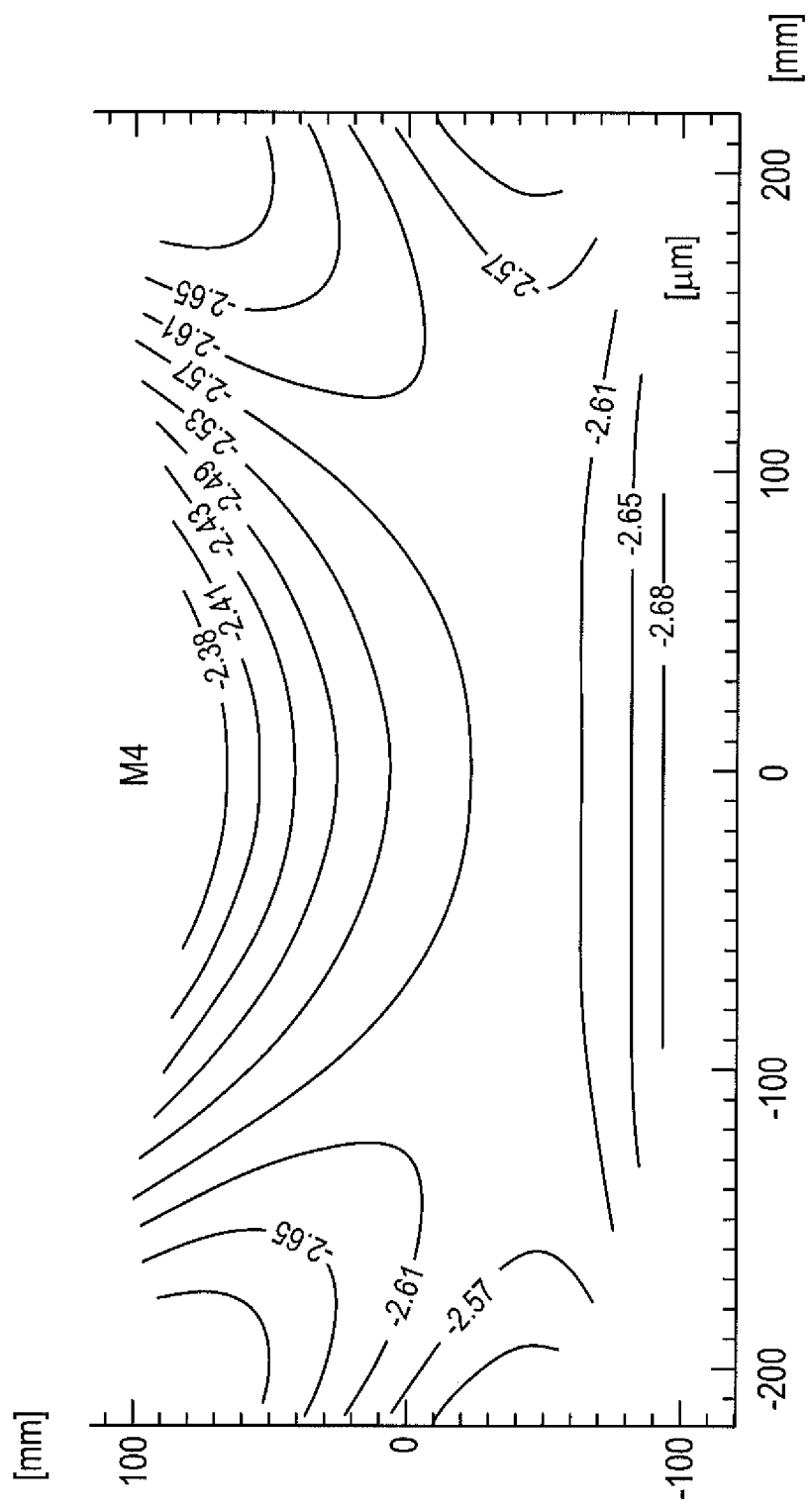
FIG. 16 a partial contour diagram of a non-rotationally symmetrical portion of the surface of the fourth mirror element of the projection objective of FIG. 12.
Figure 17:
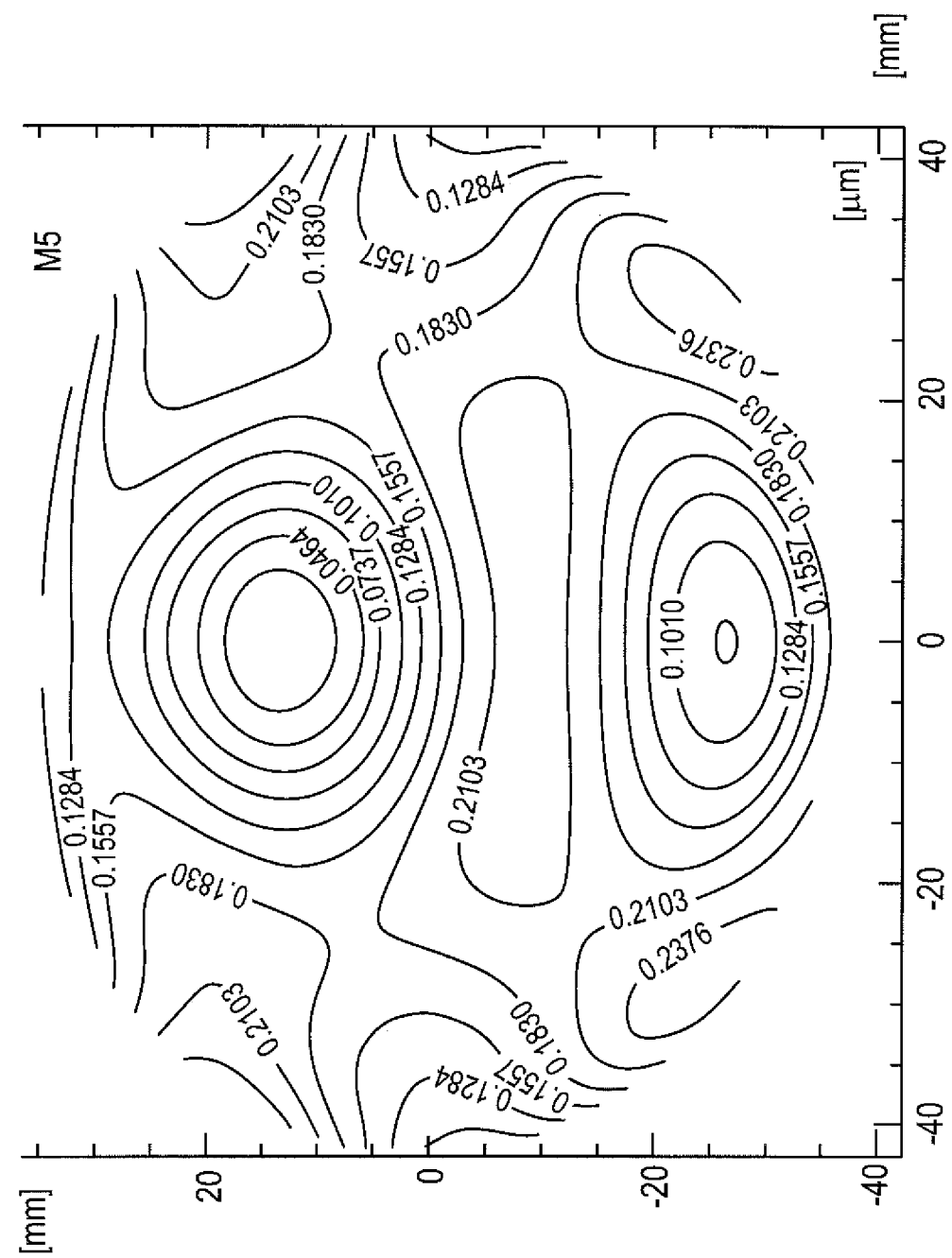
FIG. 17 a partial contour diagram of a non-rotationally symmetrical portion of the surface of the fifth mirror element of the projection objective of FIG. 12.
Figure 18:
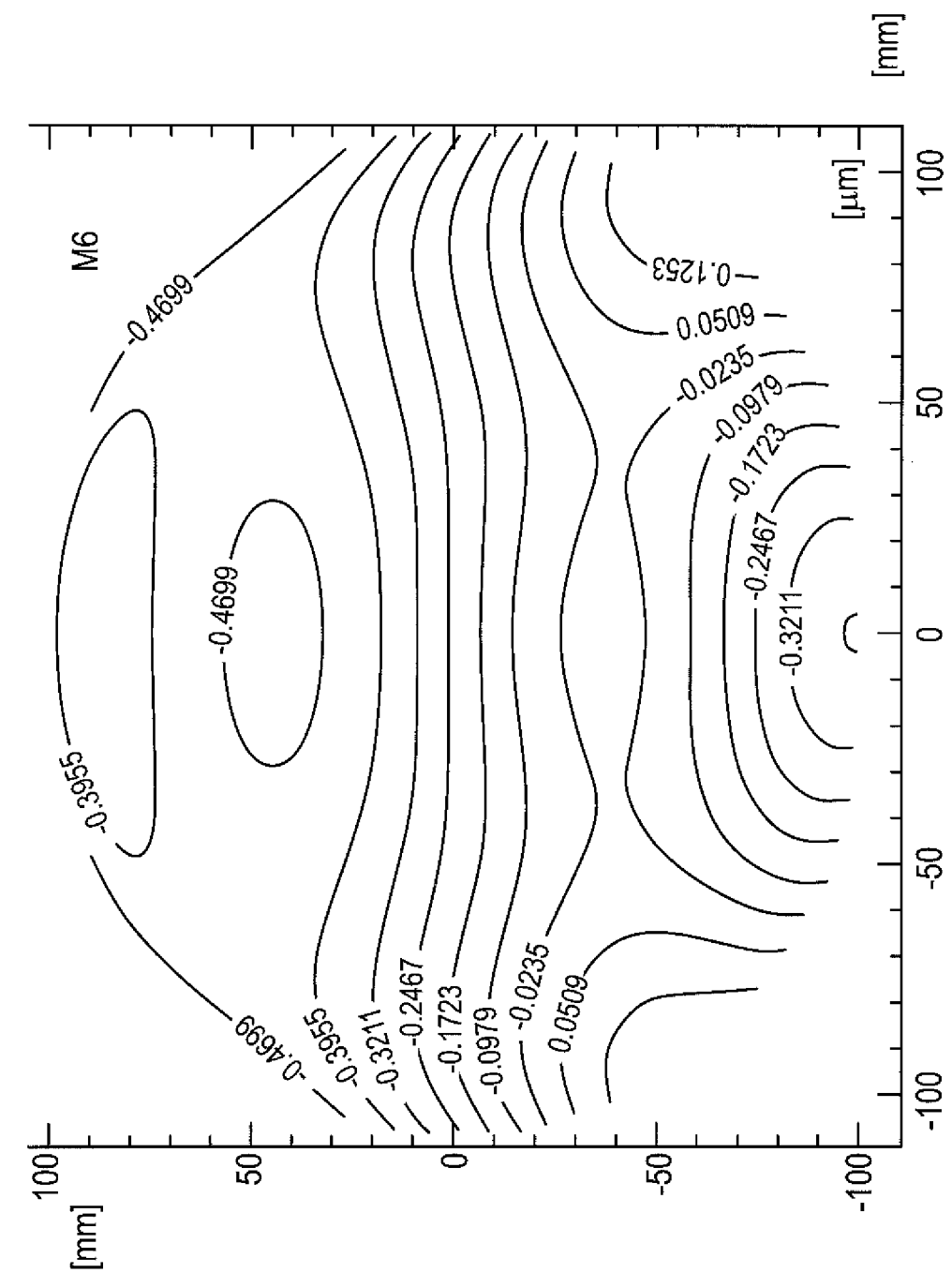
FIG. 18 a partial contour diagram of a non-rotationally symmetrical portion of the surface of the sixth mirror element of the projection objective of FIG. 12.

FIG. 12 shows a sectional view through a further exemplary embodiment according to the disclosure of an imaging optical system 10 according to FIG. 1 in the form of a projection objective of a projection exposure tool for microlithography. Like the optical system 10 according to FIG. 5, this projection objective only has reflective elements in the form of six mirrors M1 to M6 which are designed to reflect EUV radiation.

The optical surfaces of all of the mirrors M1 to M6 according to FIG. 12 are respectively in the form of so-called free form surfaces with a non-rotationally symmetrical shape. The deviations of rotationally symmetrical reference surfaces are also formed here such that the asphericities in the entire optical system 10 cancel one another out. FIGS. 13 to 18 show contour diagrams of the non-rotationally symmetrical portions respectively of the optically used region of the surfaces of the mirrors M1 to M6. In FIG. 12, as an example, the optically used region of the mirror M1 is provided with reference number 36. In Table 2 below, the sub-aperture ratios $d^{SA}/d^{CA}$ for all of the mirrors M1 to M6, the object plane 12, the pupil plane 20 and the image plane 14 of the optical system 10 according to FIG. 12 are specified.

TABLE 2

| Position | Sub-aperture ratio $d^{SA}/d^{CA}$ |
|---|---|
| Object plane | 0.000 |
| Mirror M1 | 0.282 |
| Mirror M2 | 0.461 |
| Pupil plane | 1.000 |
| Mirror M3 | 0.354 |
| Mirror M4 | 0.144 |
| Mirror M5 | 0.675 |
| Mirror M6 | 0.728 |
| Image plane | 0.000 |

As can be seen from Table 2, the sub-aperture ratios deviate considerably from one another. The smallest deviation is between mirrors M5 and M6. However, the deviation is still greater than 0.05 here.

All of the mirrors M1 to M6 are disposed rotatably in relation to a reference axis 30 perpendicular to the image plane 14 in order to manipulate the wavefront of the optical system 10 according to FIG. 12. In the present embodiment all of the mirrors have the same axis of rotation. In other embodiments different axes of rotation can, however, also be assigned to the individual mirrors.

Figure 19:
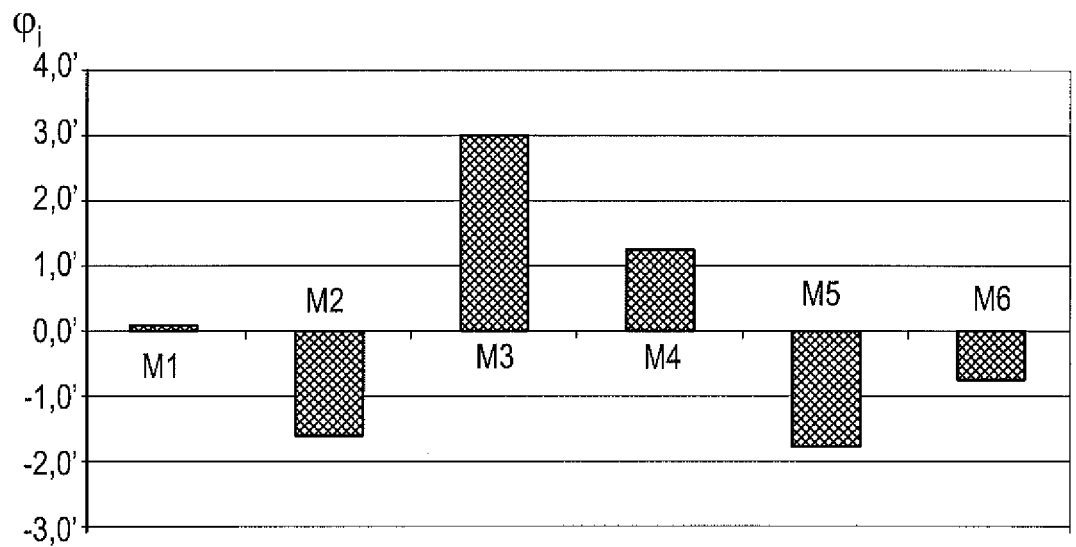
FIG. 19 a rotational configuration of the mirror elements of the projection objective according to FIG. 12.
Figure 20:
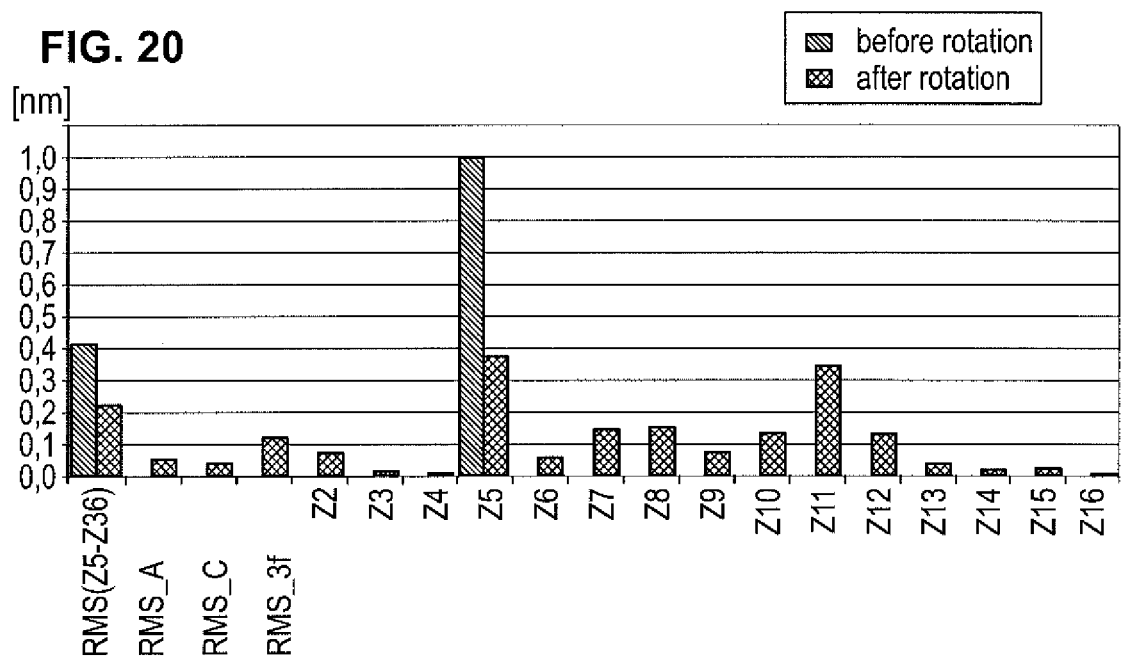
FIG. 20 the effect of the rotation of the mirror elements according to the rotational configuration of FIG. 19 upon image errors.

FIG. 19 shows a rotational configuration of the mirrors M1 to M6 which enables partial correction of the Zernike coefficient Z5 in the wavefront W. For this purpose the respective angles of rotation $\varphi_i$ for the mirrors M1 to M6 are shown. FIG. 20 shows an image error distribution before and after rotation of mirrors M1 to M6 according to FIG. 19. Here the maximum values occurring in the image field for Zernike coefficients Z2 to Z16 are respectively shown. Furthermore, for the purpose of illustration, the maximum RMS value for all Zernike coefficients (RMS_A) bringing about astigmatism, the maximum RMS value for all Zernike coefficients ($RMS_C$) bringing about coma, the maximum RMS value for all Zernike coefficients (RMS_3f) bringing about a 3-fold aberration, and the maximum RMS value for Zernike coefficients Z5 to Z36 are specified.

The simply hatched bars show a starting position before rotation in which only Zernike coefficient Z5 is different from zero. The maximum value for Z5 over the field is applied with 1 nm, the values of all other Zernike coefficients with 0 nm. If mirrors M1 to M6 are now rotated by the angle shown in FIG. 19 in arc minutes, the image error distribution changes, as shown in FIG. 20 by the cross-hatched bars.

The value for Z5 decreases to less than half, whereas other Zernike coefficients adopt values different from zero. The RMS value for Z5 to Z36 taken together decreases, however, to approximately half. The rotational configuration shown makes it possible, therefore, to correct an image error in Z5 to a large extent.

Figure 21:
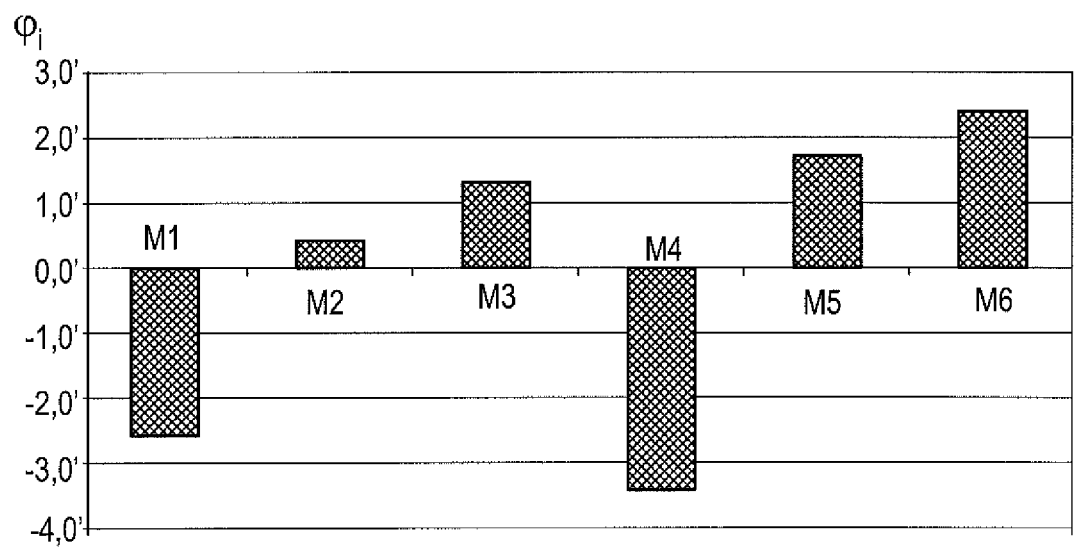
FIG. 21 a further rotational configuration of the mirror elements of the projection objective according to FIG. 12.
Figure 22:
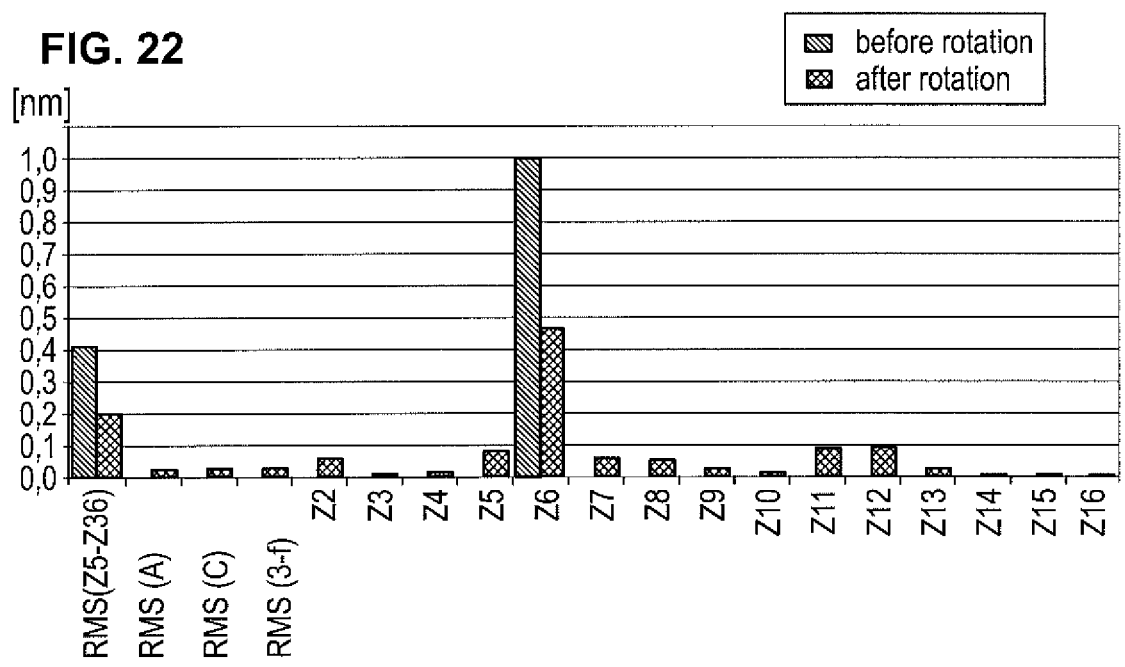
FIG. 22 the effect of the rotation of the mirror elements according to the rotational configuration of FIG. 21 upon image errors.

FIG. 21 shows a further rotational configuration of mirrors M1 to M6 of the imaging system 10 according to FIG. 12. With this rotational configuration an image error in Z6 can be corrected, as illustrated in FIG. 22.

As already explained via the optical system 10 according to FIG. 5, the surface shape of a mirror of an optical system in one of the embodiments described above can be formed, e.g. by combining a non-rotationally symmetrical basic shape g initially resulting from a design calculation, with a superposition form, which is likewise non-rotationally symmetrical. The shape produced taking into consideration the superposition form forms the basis of the mirror production. A superposition form of this type, serving as a manipulation form, can be configured such that the derivations of the latter produce in certain spatial directions aberrations to be compensated.

Figure 23:
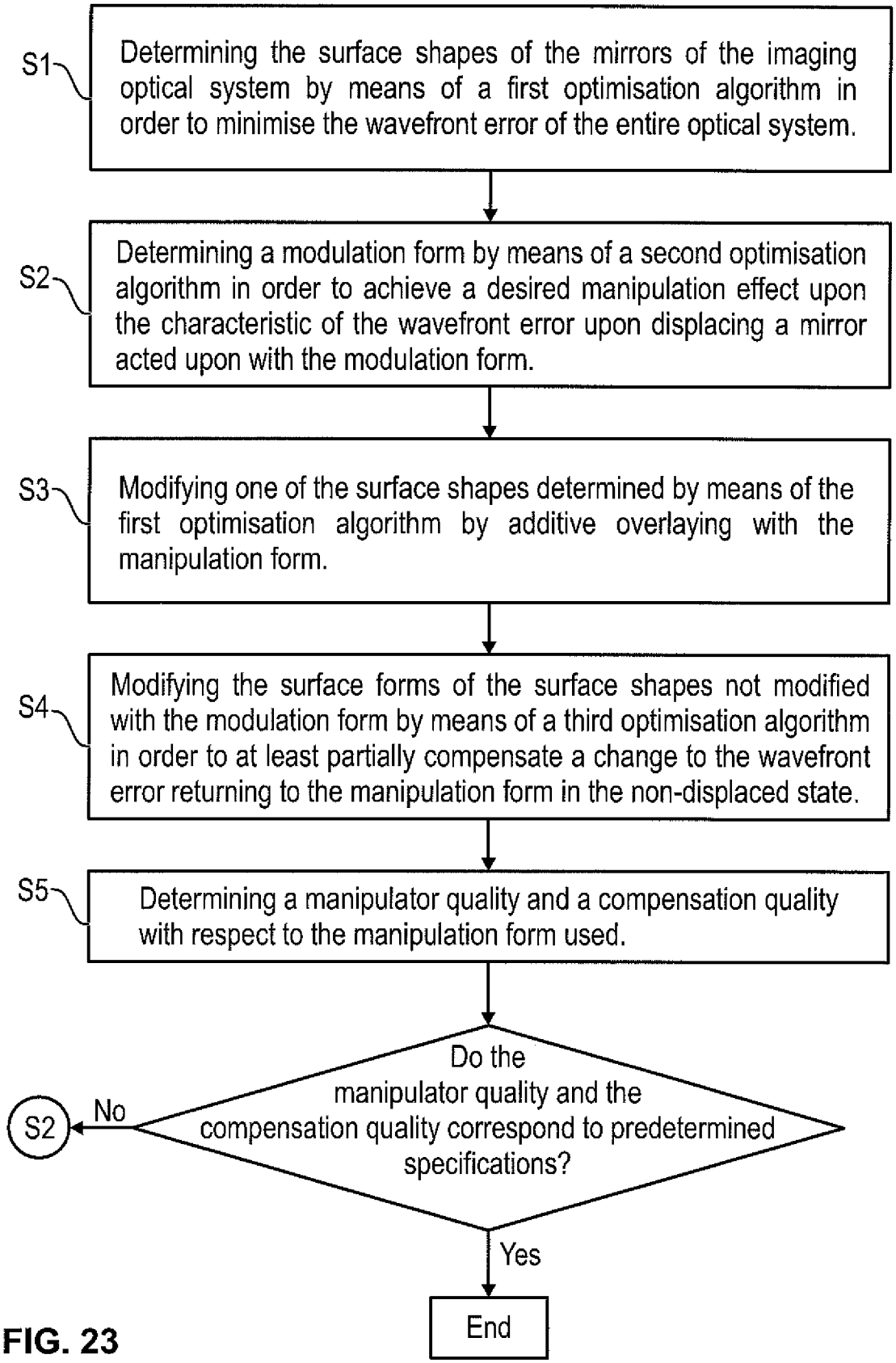
FIG. 23 a flow chart illustrating an embodiment of a method according to the disclosure for the optical design of an imaging optical system.

FIG. 23 shows a flow chart illustrating an embodiment of a method according to the disclosure for the optical design of an imaging optical system 10 for microlithography in one of the embodiments according to the disclosure described above, which includes mirrors having non-rotationally symmetrical surfaces.

In the design method shown in FIG. 23, in a first step S1 a conventional optical design calculation is first of all implemented with which the wavefront error of the entire optical system 10 is minimized. Here, via a first optimization algorithm the surface shapes of the optical elements in the form of mirrors are determined such that a wavefront error of the entire optical system achieves or falls below a pre-specified threshold characteristic. The threshold characteristic can, for example, specify different thresholds for individual Zernike coefficients, uniform thresholds for the Zernike coefficients, or also just one RMS value for the entire wavefront deviation. Thresholds for values derived from the Zernike coefficients can also be specified. An appropriate threshold for the Zernike coefficients can, dependently upon aperture and the specification for the entire wavefront deviation, be for example 0.2 nm, 0.1 nm or also 0.05 nm for an EUV system.

As a next step a manipulation form for additive overlaying over the surface of a mirror is specified, which is configured such that when displacing this mirror, in the following also called a manipulator mirror, the characteristic of the wavefront error can be manipulated in a desired way. In connection with this one also speaks of a desired manipulation effect. Therefore, the manipulation form can be designed, for example, such that by displacing the mirror acted upon by the latter, a specific Zernike image error, such as for example astigmatism, or a specific combination of Zernike image errors, can be changed. Displacement of the mirror can include a shift, a rotation and/or tilting relative to a reference axis disposed perpendicularly to the image plane.

The selection of a mirror of the imaging optical system for use as a manipulator mirror can be made according to different criteria. According to one embodiment the sub-aperture ratios of all of the mirrors of the optical system are compared with one another, and one or more mirrors are selected as manipulator mirrors, the sub-aperture ratio of which is disposed as close a possible to the sub-aperture ratios of a largest possible number of remaining mirrors of the optical system. The definition of the sub-aperture ratio corresponds here to the definition given above. As can be seen via the exemplary embodiment shown in FIG. 5, the decision for the selection of one or more manipulator mirrors can, however, also depend upon other factors. Table 1 above shows the sub-aperture ratios of mirrors M1 to M6 of the optical system 10 according to FIG. 5. As can easily be seen, the sub-aperture ratios of mirrors M1, M3 and M4, and of mirrors M5 and M6 are respectively relatively similar to one another. In the example described above, mirrors M3 and M4 have been selected as manipulator mirrors. With this selection, in addition to the sub-aperture ratio, other factors, such as for example the available range, setting accuracies, parasitic effects, and the realisability of the desired manipulation forms are taken into consideration.

The manipulation form can, as described in step S2 in FIG. 23, be determined by via a second optimization algorithm. The image error to be corrected, the maximum amplitude to be corrected, and the position of the mirror selected as the manipulator mirror in the beam path are taken into consideration as criteria for the configuration of the manipulation form.

According to a first exemplary embodiment, a number of different base forms are initially specified in order to determine the manipulation form via the second optimization algorithm. The base forms represent base deformations of varying shape on the optical surface of the manipulator mirror. The base forms can be in the form of Zernike coefficients, splines, or functions from other function systems.

First of all the effect of each of the base forms upon the wavefront error of the optical system with a pre-specified displacement of the basic shape of the manipulation mirror overlaid with the base form is calculated. The quotient of this effect and the length of the path of displacement is also called the sensitivity of the respective base form. A path of displacement can designate a distance, as in the case of a translation, an angle interval, as in the case of a rotation or tilt, or also a combination of the latter. The sensitivities can also be calculated for a number of pre-specified displacements of different types. In the simplest case, simple rigid body movements, such as for example translations in all three spatial directions, tilts and rotations relative to a reference axis are considered with the displacement. According to one variant combinations of these rigid body movements can also be made.

In order to calculate the sensitivities, the surface shape of the simulation mirror is first of all modified by additive overlaying with respectively one of the base forms, by simulation, i.e. in the design data set. Then the effect of at least one displacement of the optical element having the modified surface shape upon the wavefront error depending on the displacement path length for each of the base forms is determined. For this purpose, for every base form the wavefront of the optical system in the non-displaced state and in the displaced state of the manipulation mirror is determined. The difference between both wavefronts corresponds to the optical effect of the displacement for the base form in question. The quotient of this difference and the displacement path length is called the sensitivity of the base form. Alternatively, the gradient of the optical effect with displacement of the manipulation form can be determined, and the manipulation form for this can be calculated with the aid of calculus.

Then the manipulation form for a desired manipulation effect is determined via the second optimization algorithm. Here the determined sensitivities of the base forms and general basic conditions, such as for example production possibilities, are used as the basis. The optimization algorithm selects an appropriate set of base forms and forms the manipulation form by an appropriate combination of the selected base forms. The combination is implemented by superposition of the appropriately weighted base forms. Here the Gaussian method of the least squares can be used.

According to a second exemplary embodiment, in order to determine the manipulation form via the second optimization algorithm a standard displacement for a selected manipulator mirror is first of all specified. This standard displacement can include, for example, a translation by a particular distance, for example a length of approximately 0.1 μm or 1.0 μm, a rotation by a particular angle, for example with a value of approximately 0.1 μrad or 1.0 μrad, or a displacement along a more complex path, consisting of decentrations and/or tilts in different degrees of freedom. In the case of the optimization of optical systems designed for EUV radiation, it can be advantageous upon the basis of calculation accuracy to choose small standard displacements.

A sensitivity s of the selected manipulation mirror is then determined as a function of the surface shape of the manipulation mirror by displacing the latter by the aforementioned standard displacement. The sensitivity s is a vector with image error sizes such as, for example, Zernike coefficients, for selected field points. The vector elements of s specify for selected image error sizes a difference between the respective image error size for the optical system determined according to step S1 with a non-displaced manipulation mirror and the corresponding image error size for the optical system, with which the manipulation mirror has been displaced by the standard displacement.

The merit function for the second optimization algorithm is then formed according to an exemplary variant via the merit function from step S1, also called the design merit function, and the following additively added term: $w(s-m)^2$. Here m is a desired value vector for the sensitivity to be achieved, and w is an appropriate weighting factor for the design merit function. The squaring is to be done in form of a scalar product. The added term brings about a linear regression. When implementing the second optimization algorithm, according to one embodiment only the surface shape of the manipulation mirror is released. The surfaces of the other mirrors are not changed and retain the shapes determined in step S1. The merit function of the second optimization algorithm brings about a combined assessment of the desired correction effect and attainment of the desired correction effect with the desired displacement travel. The term added to the design merit function can also be refined as follows: $w(s-pm)^2+qp^2+r/p^2$. Here p is an appropriate scaling factor, whereas q and r are corresponding weighting factors.

In step S3 according to FIG. 23 the design data of the surface shape of the selected manipulation mirror are modified by additive overlaying of the manipulation form determined with the surface shape of the mirror selected as a manipulator mirror. According to one variant manipulation forms for a number of mirrors can also be determined, and the design data are correspondingly modified.

In step S4 the surface shapes of the other mirrors, i.e. the mirrors not modified with the manipulation form, are modified via a third optimization algorithm. The aim of this modification is to at least partially compensate again the wavefront deviation introduced into the optical system through the manipulation form in the state in which the manipulation mirror is non-displaced. In other words, in step S4 the non-modified surface shapes are changed via the third optimization algorithm such that a change to the wavefront error of the optical system brought about by the modification of the surface of the manipulation mirror in the non-displaced state is at least partially compensated. The respective change of the surface shapes not acted upon with the manipulation form is also called the compensation form. As a result, for all of the mirrors, apart from the manipulation mirror, compensation forms are determined which are additively overlaid with the surface shape, also called the basic shape, determined under step S1.

As already mentioned above, the manipulation form and the compensation forms now determined are also designated by the generic term "superposition forms". The superposition forms of all of the mirrors of the optical system even one another out in total along the light direction so that the imaging quality over the image field is not substantially affected, i.e. remains within predetermined image error specifications. For a single field point there exists for this purpose an infinite diversity of solutions because as the only property, the sum of all superposition forms over the aperture is close to zero. For an expanded image field, or an image field discretized at a number of points, the respective totals, however, disappear over the beam paths of further image field points or come at least within the specifications. These numerous additional conditions for each field point considered restrict the diversity of solutions.

Preferably, the superposition forms for optical systems are configured with aberration progressions varying slowly over the field. In this case a restricted field point number for the calculations is sufficient so that sufficient solution possibilities are available. According to one exemplary embodiment, for example, the aberration progressions vary slowly over the field such that consideration of, for example, 5×13 field points over a slot-shaped scanner field is sufficient in order to calculate the compensation forms. In this case sixty-five conditions are to be fulfilled for the totals of the superposition form aberrations.

The wavefront error of the optical system achieved by the compensation is quantified by a so-called compensation quality k. The compensation quality k specifies to what extent the change to the wavefront error, which is produced by the modification of the surface shape of the manipulation mirror in the non-displaced state, is compensated by the change to the surface shapes of the mirrors not modified by the manipulation form. Ideally, the wavefront error is pushed below the threshold characteristic achieved in step S1. In particular, since the manipulation mirror opens up, however, the possibility of correcting certain aberrations of the wavefront error again, it can also be acceptable if this threshold characteristic is not totally achieved, as explained in more detail below.

In other words, the compensation quality k constitutes a vector the vector elements of which specify the field point-resolved image error sizes of the design provided with the manipulation form according to which the shapes of the surfaces not modified with the modulation form have been modified via the third optimization algorithm.

In step S5, in addition to the compensation quality achieved, a manipulator quality is evaluated. The manipulator quality specifies to what extent the characteristic of the wavefront error can be changed by displacing the manipulation mirror in the desired way. The evaluation can be implemented, for example, by enquiring whether the manipulator quality and compensation quality achieve predetermined specifications or thresholds. For the compensation quality threshold characteristics reduced in relation to the threshold characteristic pre-specified under step S1 by 5%, 10%, 25%, and in exceptional cases also by 50%, can be applied.

According to one variant, during the evaluation the thresholds can, however, also be formed flexibly for the manipulator quality and the compensation quality. Therefore, for example, in the case where a particularly high manipulator quality is achieved, the desire for the compensation quality can be reduced and vice versa.

The manipulator quality can be specified by a vector f, the individual vector coordinates of which relate to different Zernike coefficients of the wavefront expansions at different selected field points, and so specify the manipulator quality in relation to the corresponding Zernike coefficients. The vector f is determined as follows:

$$\min\{f:|s-pm|\leq f\cdot(h(p)|m|+\acute{o}(p))\} \quad (27)$$

Here, s, p and m are defined as in the second exemplary embodiment under step S2 and h and p are functions, the values of which take the same dimension as f and its components from the positive real numbers. For example functions h and ó(p) may be used, which are defined component by component h=$h_i$ with $h_i$ (p)=1 or $h_i$ (p)=p and ó=$ó_i$ with $ó_i$ (p)=1/p.

The compensation quality k and the manipulation quality can be combined with methods known to the person skilled in the art to form a merit function, such as, for example, $w(s-pm)^2+qp^2+r/p^2+tk^2$. Here, s, m, p, q and r are defined as in the second exemplary embodiment under step S2, t is an appropriate scalar, and k the compensation quality. With this merit function steps S2 and S4 can be combined to form an optimization algorithm.

The assessment of the compensation quality can be made according to different criteria. The compensation quality is basically dependent upon the error budget allocated to the design and the overall budget applied during operation of the optical system. In order to assess the compensation quality, the relative ratio of the image error to the sought after design budget or to the sought after overall budget, for example, can be drawn upon. The relative ratio can, for example, be formed respectively for relevant Zernike coefficients. If the ratio from the non-compensatable design image error and the design budget is smaller than or equal to a specific threshold, the design is considered sufficient with regard to the compensation quality. The threshold for the aforementioned ratio can be e.g. 1.05. Ratios of, for example, 0.1, 0.9, 1.0 or 1.05 are therefore accepted. With ratios greater than the threshold, for example 1.06, 1.5 or 2.0, according to one embodiment the budget consumption is considered within the context of the overall budget. If the relative ratio of the non-compensatable design error to the overall budget is clearly greater here than 0.3 or in the region of 0.5 or greater, the design will not be accepted with regard to the compensation quality. Several Zernike-specific exceptions are also conceivable here, however, depending on the application.

The assessment of the manipulator quality f can be made upon the basis of a threshold specified for f. According to one embodiment the manipulator quality is assessed positively if f, component by component, is smaller than a threshold of 0.5. Alternatively, the threshold, component by component, can be 0.1, preferably 0.03 or 0.01.

If the evaluation of the manipulator quality and the compensation quality prove to be positive, the design method is completed. The at least one manipulation form determined, and the compensation forms determined form the basis of the design data of the optical system and are taken into account accordingly when producing the mirrors.

However, if the evaluation of the manipulator quality and the compensation quality prove to be negative, both the at least one manipulation form determined and the compensation forms determined are rejected, and steps S2 to S5 are repeated. Here, in step S2, the parameters decisive for determining the manipulation form are changed so that, as a result, a different manipulation form is determined. This procedure is repeated until there is a manipulation form satisfying the specifications with regard to manipulator quality and compensation quality.

The decisive parameters which are changed when determining the manipulation form in step S2 in the case of negative assessment of the manipulator quality and the compensation quality, can e.g. relate to the distance covered during the displacement. According to the second exemplary embodiment under step S2, the sensitivity s of the selected manipulation mirror relates to the distance covered. By increasing the distance, the design is relaxed, and this makes it easier to find an easily correctable solution.

Alternatively, or in addition, the sought after modulation form sensitivity can also be changed. Therefore, for example, the originally determined manipulation form can be changed such that individual image error parameters are specifically influenced in the resulting wavefront.

Alternatively, or in addition, in the case of negative assessment of the compensation quality the thresholds of the image error sizes observed which form the basis when determining the compensation quality, can be increased. Zernike coefficients smaller than Z10, in particular the Zernike coefficients Z2 and Z3, can easily be corrected by rigid body movements. It can therefore be advantageous, for example, to increase the thresholds for easily correctable Zernike coefficients.

Alternatively, or in addition, in the case of a negative assessment of the compensation quality a greater design contribution to the overall error budget can be permitted.

In the following a further embodiment of a method according to the disclosure for the optical design of an imaging optical system 10 for microlithography with a pre-specified number of optical elements in the form of mirrors is described. According to this method the surface shapes of the mirrors are determined via an optimization algorithm characterized by a merit function, also called a quality function. The merit function used here includes as evaluation values a wavefront error of the entire optical system and at least one so-called manipulation sensitivity. The manipulation sensitivity is defined by an effect of displacement of one of the mirrors, in the following also called the manipulation mirror, upon an aberration of the optical system. An aberration is defined by a pre-specified characteristic of the wavefront error of the optical system, and can be given by an individual Zernike aberration or also by a combination of Zernike aberrations.

In other words, the manipulation sensitivity defines a response behaviour of a wavefront aberration depending on displacement of a mirror designated as a manipulator mirror. Displacement can, as already explained with regard to the above design method, include translation in any spatial direction, rotation about a reference axis and/or tilting relative to the reference axis. The manipulation sensitivity establishes a relationship between the extent of the displacement, such as for example the length of the path of displacement, and the extent of the wavefront aberration changed in this way.

The optimization algorithm then determines design data for the surface shapes of the optical elements. These design data ensure, on the one hand, that the wavefront error of the resulting optical system is minimized such that a pre-specified threshold characteristic is achieved or fallen short of in the same way as in step S1 of the design method according to FIG. 23. On the other hand, at least one surface pattern is formed in the design data such that the mirror in question serves as a manipulation mirror in accordance with the terminology used above. In other words, this mirror is configured such that when the latter is displaced, the characteristic of the wavefront error of the optical system can be changed such that a wavefront aberration can thus be specifically corrected.

In comparison to the design method according to FIG. 23, by incorporating the manipulation sensitivity into the merit function, the design of the optical system with which at least one mirror has a manipulator function, can be produced via a single optimization algorithm.

The optimization algorithms mentioned above can include different algorithms commonly used by the person skilled in the art. This applies in particular to the optimization algorithms in the embodiment according to FIG. 23 and to the optimization algorithm, the merit function of which includes as an evaluation parameter a manipulation sensitivity.

The aforementioned algorithms commonly used by the person skilled in the art include in particular: singular value decomposition, also called SVD, the Gaussian method of the least squares, also called LSQ, attenuated LSQ, linear programming, quadratic programming and convex programming. With regard to details on the aforementioned algorithms, reference is made explicitly to WO 2010/034674 A1. Further optimization algorithms commonly used by the person skilled in the art and suitable for use in the design methods according to the disclosure include genetic algorithms, the ant algorithm, the flood algorithm, simulated annealing, whole number programming, also called integer programming, as well as classical combinatory methods.

Figure 24:
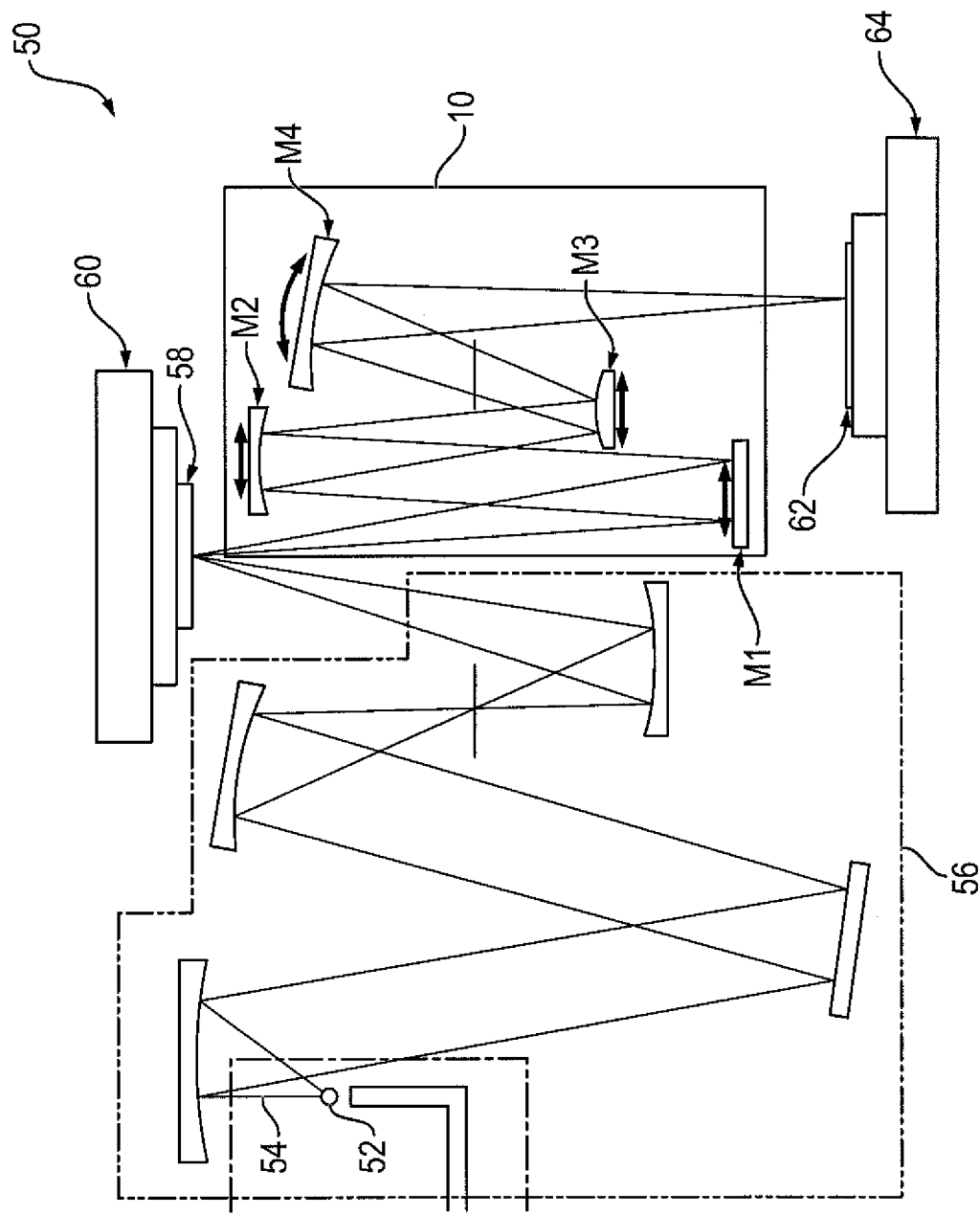
FIG. 24 an EUV projection exposure tool with an embodiment according to the disclosure of an imaging optical system.

FIG. 24 shows an embodiment of a projection exposure tool 50 for microlithography with a further embodiment of an imaging optical system 10 in the form of a projection objective. The projection exposure tool 50 is designed to operate in the EUV wavelength range, and includes an exposure radiation source 52 for producing EUV exposure radiation 54. The exposure radiation source 52 can be designed e.g. in the form of a plasma radiation source. The exposure radiation 54 initially passes through illumination optics 56 and is directed by the latter onto a mask 58. The mask 58 includes mask structures for imaging onto a substrate 62 in the form of a wafer, and is mounted displaceably on a mask movement stage 60, also called a "reticle stage".

The exposure radiation 54 is reflected on the mask 58 and then passes through the imaging optical system 10 in the form of a projection objective which is configured to image the mask structures onto the substrate 62. The substrate 62 is displaceably mounted on a substrate movement stage 64, also called a "wafer stage". The projection exposure tool 50 can be designed as a so-called "scanner", or also as a so-called "stepper". The exposure radiation 54 is guided within the illumination optics 56 and the imaging optical system 10 via a plurality of optical elements in the form of reflective optical elements—mirrors. The reflective optical elements are configured in the form of EUV mirrors and are provided with conventional multiple coatings, for example MoSi multiple coatings.

In the embodiment according to FIG. 24 the imaging optical system 10 only includes four reflective optical elements in the form of the mirrors M1 to M4. In this embodiment all of the mirrors are mounted moveably. The mirrors M1, M2 and M3 are mounted displaceably laterally to their respective optical surface, and mirror M4 is mounted tiltably. Therefore all of the mirrors M1 to M4 can be used to manipulate the wavefront. One or more of the mirrors M1 to M4 include one of the manipulation forms described above with a non-rotationally symmetrical shape. Therefore, in the present embodiment, the mirrors not configured with a manipulation form are mounted moveably in order to have additional degrees of freedom in the system. The moveability of these mirrors is optional, however, for the manipulator function of the manipulation forms.

LIST OF REFERENCE NUMBERS 10 imaging optical system
12 object plane
13 object field
$O_1$, $O_2$ points of the object field
14 image plane
15 system axis
16 image field
$B_1$, $B_2$ points of the image field
$18_1$, $18_2$ imaging beam path
19 imaging beam path
20 pupil plane
22 aperture diaphragm
24 pupil
$T_1$, $T_2$ partial wave
M1-M6 mirrors
M mirror
26 free form surface
28 reference surface
30 reference axis
32 double arrow
34 double arrow
36 optically used region
36' region rotated by 180°
$38_3$, $38_4$ axis of rotation
40 remaining region
42 circle segment
44 axis of symmetry 50 projection exposure tool for microlithography
52 exposure radiation source
54 exposure radiation
56 illumination optics
58 mask
60 mask shifting stage
62 substrate
64 substrate shifting stage

What is claimed is:

1. An imaging optical system, comprising:
optical elements configured to guide electromagnetic radiation with a wavelength λ in an imaging beam path to image an object field into an image field, the optical elements comprising a first optical element,
wherein:
the imaging optical system has a pupil with first and second coordinates;
the image field has first and second coordinates;
the image field and the pupil span an extended 4-dimensional pupil space having the first and second coordinates of the pupil and the first and second coordinates of the image field;
during use of the imaging optical system, a wavefront of the electromagnetic radiation passing through the imaging optical system is defined as a function of the extended 4-dimensional pupil space;
the first optical element has a non-rotationally symmetrical surface with a two-dimensional surface deviation relative to every rotationally symmetrical surface;
the two-dimensional surface deviation has a difference between its greatest elevation and its deepest valley of at least λ;
for each point of the object field, a sub-aperture ratio of the non-rotationally symmetrical surface deviates by at least 0.01 from a sub-aperture ratio of every other surface of the optical elements at the point of the object field;
the non-rotationally symmetric surface of the first optical element is configured so that, by displacing the first optical element relative to the other optical elements, a change to the wavefront occurs;
the change to wavefront has a portion with at least 2-fold symmetry;
a maximum value of the wavefront change in the extended 4-dimensional pupil space is at least $1 \times 10^{-5}$ of the wavelength λ; and
the imaging optical system is a microlithography imaging optical system.

2. The imaging optical system of claim 1, wherein a minimum distance between the first optical element and its adjacent optical elements is five centimeters.

3. The imaging optical system of claim 1, wherein the sub-aperture ratio for each of the optical elements deviates by at least 0.01 from the respective sub-aperture ratio of the other optical elements.

4. The imaging optical system of claim 1, wherein the optical elements are configured such that every combination of two of the optical elements has an optical effect of a non-rotationally symmetrical optical element.

5. The imaging optical system to of claim 1, wherein non-rotationally symmetrical surfaces of the optical system are disposed in planes which are not conjugate to one another.

6. The imaging optical system to of claim 1, wherein the optical elements comprise mirrors.

7. The imaging optical system of claim 1, wherein the electromagnetic radiation is EUV radiation.

8. The imaging optical system of claim 1, wherein at least three of the optical elements have a non-rotationally symmetrical surface.

9. The imaging optical system of claim 1, wherein displacing the first optical element comprises rotating the first optical element.

10. The imaging optical system of claim 1, wherein displacing the first optical element comprises rotating the first optical element relative to a reference axis disposed perpendicular to the image field.

11. The imaging optical system of claim 10, wherein displacing the first optical element further comprises tilting the first optical element relative to the reference axis disposed perpendicular to the image field.

12. The imaging optical system of claim 1, wherein the imaging optical system is configured so that rotating the first optical element changes an astigmatism of the imaging optical system.

13. The imaging optical system of claim 1, wherein displacing the first optical comprises rotating the first optical element relative to an axis of rotation which runs through a center point of a sphere best-adapted to the non-rotationally symmetrical surface.

14. The imaging optical system of claim 1, wherein displacing the first optical element comprises shifting the first optical element.

15. The imaging optical system of claim 1, wherein a non-rotationally symmetrical portion of the non-rotationally symmetric surface of the first optical element has an n-fold symmetry, and a value of n is at least two.

16. The imaging optical system of claim 1, wherein a non-rotationally symmetrical portion of the non-rotationally symmetric surface of the first optical element has an astigmatic form.

17. The imaging optical system of claim 1, wherein the non-rotationally symmetric surface of the first optical element has a rotationally symmetrical portion, and an amplitude of the rotationally symmetrical portion is small in comparison to an amplitude of a non-rotationally symmetrical portion.

18. The imaging optical system of claim 1, wherein the imaging optical system comprises four to eight optical elements with a non-rotationally symmetrical surface.

19. A method, comprising:
using an algorithm to determine surface shapes of optical elements of a microlithography system so that a wavefront error of the entire imaging optical system is at most a pre-specified value; and
using the algorithm to modify at least one of the surface shapes by additive overlaying with a manipulation form configured so that, when displacing the optical element having the modified surface shape, the wavefront error of the optical system changes,
wherein the imaging optical system is an imaging optical system according to claim 1.

20. The method of claim 19, further comprising using a further algorithm to change the non-modified surface shapes to at least partially compensate for a change to the wavefront error of the optical system brought about by the modification of the at least one optical surface shape in the non-displaced state.

21. The method of claim 20, further comprising determining a manipulator quality and a compensation quality with respect to the manipulation form used,
wherein:
the manipulator quality specifies to what extent the characteristic of the wavefront error can be changed in the desired way by displacing the optical element comprising the manipulation form; and
the compensation quality specifies to what extent the change to the wavefront error, which is produced by modifying the at least one optical surface shape with the manipulation form in the non-displaced state, is compensated by the change to the surface shapes of the optical elements not modified by a manipulation form; and
the method further comprises, based on the manipulator quality determined and of the compensation quality, deciding whether to use the manipulation form used in the design.

22. The method of claim 19, wherein the imaging optical system is configured to operate with a wavelength $\lambda$, the manipulation form defines a non-rotationally symmetrical surface which has a respective two-dimensional surface deviation in relation to every rotationally symmetrical surface, and the two-dimensional surface deviation has a difference between its greatest elevation and its deepest valley of at least $\lambda$.

23. The method of claim 19, wherein:
the manipulation form is configured so that, when displacing the optical element having the modified surface shape, the characteristic of the wavefront error of the optical system changes so that the change to the wavefront error is brought about which has a portion with at least 2-fold symmetry; and
a maximum value of the wavefront change in an extended 4-dimensional pupil space is at least $1 \times 10^{-5}$ of the wavelength $\lambda$.

24. The method of claim 19, wherein the manipulation form is configured so that, when displacing the optical element having the modified surface shape, the wavefront error of the optical system changes so that the wavefront error is specifically corrected by a Zernike image error.

25. The method of claim 19, wherein determining the manipulation form comprises:
pre-specifying a number of base forms;
simulatedly modifying the surface shaped provided for the manipulation form by additively overlaying with a base form;
calculating an effect of at least one displacement of the optical element having the modified surface shape upon the wavefront error for each of the base forms; and
using a further algorithm to select a set of base forms based on a desired manipulation effect and generation of the manipulation form by combining the selected base forms.

26. A method, comprising:
using a merit function of an algorithm to determine surface shapes of optical elements of a microlithography imaging optical system, the merit function comprising as evaluation parameters a wavefront error of the entire imaging optical system and at least one manipulation sensitivity defined by an effect of a displacement of one of the optical elements un an aberration of the imaging optical system defined by a pre-specified characteristic of the wavefront error,
wherein the imaging optical system is an imaging optical system according to claim 1.

27. The imaging optical system of claim 1, wherein displacing the first optical element comprises tilting the first optical element relative to a reference axis disposed perpendicular to the image field.

28. An imaging optical system, comprising:
optical elements configured to guide electromagnetic radiation with a wavelength $\lambda$ in an imaging beam path to image an object field into an image field, the optical elements comprising a first optical element,
wherein:
the imaging optical system has a pupil with first and second coordinates;
the image field has first and second coordinates;
the image field and the pupil span an extended 4-dimensional pupil space having the first and second coordinates of the pupil and the first and second coordinates of the image field;
during use of the imaging optical system, a wavefront of the electromagnetic radiation passing through the imaging optical system is defined as a function of the extended 4-dimensional pupil space;
the first optical element has a non-rotationally symmetrical surface with a two-dimensional surface deviation relative to every rotationally symmetrical surface;
the two-dimensional surface deviation has a difference between its greatest elevation and its deepest valley of at least $\lambda$;
for each point of the object field, a sub-aperture ratio of the non-rotationally symmetrical surface deviates by at least 0.01 from a sub-aperture ratio of every other surface of the optical elements at the point of the object field;
the non-rotationally symmetric surface of the first optical element is configured so that, by displacing the first optical element relative to the other optical elements, a change to the wavefront occurs;
the change to wavefront cannot occur by displacing an optical element of the imaging optical system which has a symmetrical surface;
a maximum value of the wavefront change in the extended 4-dimensional pupil space is at least $1 \times 10^{-5}$ of the wavelength $\lambda$; and
the imaging optical system is a microlithography imaging optical system.

29. An imaging optical system, comprising:
optical elements configured to guide electromagnetic radiation with a wavelength $\lambda$ in an imaging beam path to image an object field from an object plane into an image plane,
wherein:
at least two of the optical elements have a non mirror-symmetrical surface which deviates at at least one point from each mirror-symmetrical surface by at least $\lambda/10$;
at each point of the object field, sub-aperture ratios of the non mirror-symmetrical surfaces deviate from each other by at least 0.01; and
the imaging optical system is a microlithography imaging optical system.

30. A mirror element comprising a non-rotationally symmetrical surface configured to change a wavefront of incoming radiation with a wavelength $\lambda$, in an EUV wavelength range, the non-rotationally symmetrical surface having a deviation of at least $500\lambda$ in relation to each rotationally symmetrical surface at at least one point, the mirror element being configured to be used in a microlithography imaging optical system.

31. An imaging optical system, comprising:
optical elements configured to guide electromagnetic radiation with a wavelength λ in an imaging beam path to image an object field into an image field, the optical elements comprising a first optical element,
wherein:
the imaging optical system has a pupil with first and second coordinates;
the image field has first and second coordinates;
the image field and the pupil span an extended 4-dimensional pupil space having the first and second coordinates of the pupil and the first and second coordinates of the image field;
during use of the imaging optical system, a wavefront of the electromagnetic radiation passing through the imaging optical system is defined as a function of the extended 4-dimensional pupil space;
the first optical element has a non-rotationally symmetrical surface with a two-dimensional surface deviation relative to every rotationally symmetrical surface;
the two-dimensional surface deviation has a difference between its greatest elevation and its deepest valley of at least λ;
for each point of the object field, a sub-aperture ratio of the non-rotationally symmetrical surface deviates by at least 0.01 from a sub-aperture ratio of every other surface of the optical elements at the point of the object field;
the non-rotationally symmetric surface of the first optical element is configured so that, by rotating the first optical element relative to the other optical elements by less than 10 arc minutes, a change to the wavefront occurs;
the change to wavefront has a portion with at least 2-fold symmetry;
a maximum value of the wavefront change in the extended 4-dimensional pupil space is at least $1 \times 10^{-5}$ of the wavelength λ; and
the imaging optical system is a microlithography imaging optical system.

* * * * *

UNITED STATES PATENT AND TRADEMARK OFFICE
CERTIFICATE OF CORRECTION

PATENT NO. : 10,754,132 B2
APPLICATION NO. : 13/790443
DATED : August 25, 2020
INVENTOR(S) : Olaf Rogalsky et al.

It is certified that error appears in the above-identified patent and that said Letters Patent is hereby corrected as shown below:

In the Specification

Column 8, Line 2, after "20" insert -- $m\lambda$ --;

Column 15, Line 57, delete "$W_n$ (p, q)" and insert -- $W_n(p, q)$ --;

Column 15, Line 60, after "$W_1(p, q)$" insert -- $\Xi$ --;

Column 15, Line 61, after "$W_2(p, q)$" insert -- $\Xi$ --;

Column 19, Line 26, delete "W (x,y,p,q)." and insert -- $W_u(x,y,p,q)$. --;

Column 20, Lines 6-7, delete "$W_{u\theta}(t)=\cos(k\theta)W_u(t)+\sin(k\theta)W_u(t)$." and insert -- $W_{u\theta}(t)=\cos(k\theta)W_u(t)+\sin(k\theta)W_v(t)$. --;

Column 20, Line 36, delete "und" and insert -- and --;

Column 22, Lines 56, after "$(p,q)$", insert -- , --;

Column 23, Line 53 (Approx.), delete "und" and insert -- and --;

Column 26, Line 12, delete "6" and insert -- $\delta$ --;

Column 26, Line 46, after "shapes" insert -- $g_n$ --;

Column 26, Line 58, delete "$s_n(x,y)$." and insert -- $s_n(x, y)$. --;

Column 29, Line 16, delete "$(RMS_C)$" and insert -- (RMS_C) --;

Signed and Sealed this
Twenty-seventh Day of October, 2020

Andrei Iancu
*Director of the United States Patent and Trademark Office*

In the Claims

Column 37, Line 62, Claim 5, after "system" delete "to";

Column 37, Line 66, Claim 6, after "system" delete "to";

Column 39, Line 63, Claim 26, delete "un" and insert -- in --;

Column 40, Line 65, Claim 30, delete "$\lambda$," and insert -- $\lambda$ --.